(12) United States Patent
Choi

(10) Patent No.: US 12,241,600 B2
(45) Date of Patent: Mar. 4, 2025

(54) LIGHTING MODULE AND LIGHTING DEVICE

(71) Applicant: LG INNOTEK CO., LTD., Seoul (KR)

(72) Inventor: Young Jae Choi, Seoul (KR)

(73) Assignee: LG INNOTEK CO., LTD., Seoul (KR)

(*) Notice: Subject to any disclaimer, the term of this patent is extended or adjusted under 35 U.S.C. 154(b) by 147 days.

(21) Appl. No.: 17/912,144

(22) PCT Filed: Mar. 15, 2021

(86) PCT No.: PCT/KR2021/003185
§ 371 (c)(1),
(2) Date: Sep. 16, 2022

(87) PCT Pub. No.: WO2021/187843
PCT Pub. Date: Sep. 23, 2021

(65) Prior Publication Data
US 2023/0135095 A1 May 4, 2023

(30) Foreign Application Priority Data
Mar. 20, 2020 (KR) .................. 10-2020-0034332

(51) Int. Cl.
*F21K 9/69* (2016.01)
*F21K 9/68* (2016.01)
(Continued)

(52) U.S. Cl.
CPC .................. *F21K 9/69* (2016.08); *F21K 9/68* (2016.08); *F21S 43/40* (2018.01);
(Continued)

(58) Field of Classification Search
CPC ..... F21V 11/14; G02B 6/0021; G02B 6/0036; G02B 6/004; G02B 6/0041; G02B 6/0043; H01L 33/62
See application file for complete search history.

(56) References Cited

U.S. PATENT DOCUMENTS 7,201,501 B2    4/2007   Chigusa et al.
9,728,525 B2    8/2017   Lee
(Continued)

FOREIGN PATENT DOCUMENTS

CN    101127350 A   *   2/2008   ............ H01L 24/48
EP    3460844            3/2019
(Continued)

OTHER PUBLICATIONS

Machine translation of KR 20110104403 A retrieved from the FIT database of PE2E search. (Year: 2024).*
(Continued)

*Primary Examiner* — Colin J Cattanach
(74) *Attorney, Agent, or Firm* — KED & ASSOCIATES, LLP

(57) ABSTRACT

A lighting device disclosed in an embodiment of the invention includes a substrate; a reflective layer disposed on the substrate; a light source passing through the reflective layer and disposed on the substrate; a resin layer disposed on the reflective layer; and an optical pattern disposed on the resin layer, wherein the light source includes a first light emitting device and a second light emitting device spaced apart from the first light emitting device, wherein the optical pattern may include a first optical pattern disposed on an upper portion of the first light emitting device and a second optical pattern disposed on an upper portion of the second light emitting device, and the first optical pattern and the second optical pattern may have different areas.

20 Claims, 10 Drawing Sheets

(51) Int. Cl.
*F21S 41/141* (2018.01)
*F21S 43/14* (2018.01)
*F21S 43/15* (2018.01)
*F21S 43/33* (2018.01)
*F21S 43/40* (2018.01)
*F21Y 115/10* (2016.01)
*H01L 25/075* (2006.01)
*H01L 33/48* (2010.01)
*H01L 33/52* (2010.01)
*H01L 33/60* (2010.01)
*H01L 33/62* (2010.01)

(52) U.S. Cl.
CPC ........ *H01L 25/0753* (2013.01); *H01L 33/486* (2013.01); *H01L 33/52* (2013.01); *H01L 33/60* (2013.01); *H01L 33/62* (2013.01); *F21S 41/141* (2018.01); *F21S 43/14* (2018.01); *F21S 43/15* (2018.01); *F21S 43/33* (2018.01); *F21Y 2115/10* (2016.08)

(56) References Cited

U.S. PATENT DOCUMENTS

| | | | | |
|---|---|---|---|---|
| 9,939,677 | B2* | 4/2018 | Hur | G02F 1/133605 |
| 10,957,825 | B2 | 3/2021 | Han et al. | |
| 11,757,068 | B2 | 9/2023 | Han et al. | |
| 2011/0051037 | A1* | 3/2011 | Kim | G02F 1/133603 |
| | | | | 362/235 |
| 2011/0051412 | A1* | 3/2011 | Jeong | G02F 1/133611 |
| | | | | 362/235 |
| 2011/0305004 | A1* | 12/2011 | Kim | G02F 1/133603 |
| | | | | 362/97.1 |
| 2013/0093360 | A1 | 4/2013 | Vinther et al. | |
| 2013/0264538 | A1* | 10/2013 | Oh | G02B 6/25 |
| | | | | 257/13 |
| 2013/0264590 | A1* | 10/2013 | Oh | F21S 43/15 |
| | | | | 257/88 |
| 2015/0228608 | A1* | 8/2015 | Ng | H01L 24/48 |
| | | | | 257/773 |
| 2016/0099236 | A1* | 4/2016 | Oh | G02B 6/0088 |
| | | | | 257/88 |
| 2017/0123141 | A1* | 5/2017 | Park | F21S 41/151 |
| 2017/0222109 | A1 | 8/2017 | Kim | |
| 2019/0081113 | A1 | 3/2019 | Gu et al. | |
| 2019/0097094 | A1 | 3/2019 | Han et al. | |
| 2021/0175395 | A1 | 6/2021 | Han et al. | |
| 2021/0284063 | A1* | 9/2021 | Wang | B60Q 3/54 |

FOREIGN PATENT DOCUMENTS

| | | | | |
|---|---|---|---|---|
| JP | 2004-071409 | | 3/2004 | |
| KR | 10-2010-0127623 | | 12/2010 | |
| KR | 20110104403 A | * | 9/2011 | |
| KR | 10-2013-0007170 | | 1/2013 | |
| KR | 10-2013-0134971 | | 12/2013 | |
| KR | 10-2014-0078375 | | 6/2014 | |
| KR | 10-2019-0098641 | | 8/2019 | |
| WO | WO-2016050056 A1 | * | 4/2016 | ............... F21S 8/00 |

OTHER PUBLICATIONS

Machine translation of WO 2016050056 A1 retrieved from the FIT database of PE2E search. (Year: 2024).*
Machine translation of CN-101127350-A retrieved from the FIT database of PE2E search. (Year: 2024).*
International Search Report dated Jul. 5, 2021 issued in Application No. PCT/KR2021/003185.
European Search Report dated Mar. 1, 2024 issued in Application No. 21770952.6.

* cited by examiner

LIGHTING MODULE AND LIGHTING DEVICE

CROSS-REFERENCE TO RELATED PATENT APPLICATIONS

This application is a U.S. National Stage Application under 35 U.S.C. § 371 of PCT Application No. PCT/KR2021/003185, filed Mar. 15, 2021, which claims priority to Korean Patent Application No. 10-2020-0034332, filed Mar. 20, 2020, whose entire disclosures are hereby incorporated by reference.

TECHNICAL FIELD

An embodiment of the invention relates a lighting module having a plurality of light sources and a lighting device having the same. An embodiment of the invention relates to a lighting module having a different size of at least one of a plurality of LEDs, and a lighting device having the same.

BACKGROUND ART

Lighting applications include vehicle lights as well as backlights for displays and signage. A light emitting device, for example, a light emitting diode (LED), has advantages such as low power consumption, semi-permanent life, fast response speed, safety, and environmental friendliness compared to conventional light sources such as fluorescent lamps and incandescent lamps. These light emitting diodes are applied to various display devices, various lighting devices such as indoor or outdoor lights. Recently, as a vehicle light source, a lamp employing a light emitting diode has been proposed. Compared with incandescent lamps, light emitting diodes are advantageous in that power consumption is small. However, since a directivity angle of light emitted from the light emitting diode is small, when the light emitting diode is used as a vehicle lamp, there is a demand for increasing the light emitting area of the lamp using the light emitting diode. Since the light emitting diode is small, it may increase the design freedom of the lamp, and it is economical due to its semi-permanent life.

DISCLOSURE

Technical Problem

Embodiment of the invention may provide a lighting module and a lighting device in which a light source is sealed in a resin layer and at least one of the light emitting devices of the light source has a size different from that of another light emitting device. An embodiment of the invention may provide a lighting module and a lighting device in which a light source is sealed in a resin layer and at least one of the light emitting devices of the light source has a size smaller than the size of another light emitting device. An embodiment of the invention may provide a lighting module and a lighting device in which a light source is sealed in a resin layer and optical patterns is respectively disposed on the light emitting devices of the light source, wherein at least one of the optical patterns has an area different from that of another optical pattern. An embodiment of the invention may provide a lighting module and a lighting device in which at least one of the optical patterns is respectively disposed on the light emitting devices has an area smaller than that of the other optical patterns. An embodiment of the invention may provide a lighting module and a lighting device in which at least two light emitting devices has different lengths in one direction and different numbers of LED chips.

Technical Solution

A lighting device according to an embodiment of the invention includes: a substrate; a reflective layer disposed on the substrate; a light source passing through the reflective layer and disposed on the substrate; a resin layer disposed on the reflective layer; and an optical pattern disposed on the resin layer, wherein the light source includes a first light emitting device and a second light emitting device spaced apart from the first light emitting device, wherein the optical pattern includes a first optical pattern disposed on an upper portion of the first light emitting device and a second optical pattern disposed on an upper portion of the second light emitting device, and the first optical pattern and the second optical pattern may have different areas.

According to an embodiment of the invention, the first optical pattern and the second optical pattern may have a plurality of unit pattern layers having different areas and overlapping each other. An area of the unit pattern layer disposed on the uppermost side of the first optical pattern may be larger than an area of the unit pattern layer disposed on the uppermost side of the second optical pattern. An area of the unit pattern layer disposed on the uppermost side of the plurality of unit pattern layers of the first optical pattern may be larger than an area of the unit pattern layer of the lowermost side thereof. According to an embodiment of the invention, the reflective layer may include a first hole in which the first light emitting device is disposed and a second hole in which the second light emitting device is disposed, and the first hole may be larger than the second hole. A length of the long axis direction of the first hole may be greater than a length of the long axis direction of the second hole. According to an embodiment of the invention, the maximum length of the first optical pattern may be in the range of 2.4 times to 2.6 times based on the length of the long axis of the first light emitting device, and the length of the long axis of the second optical pattern may be in the range of 3.6 times to 3.8 times based on the length of the long axis of the second light emitting device. A lighting device according to an embodiment of the invention includes: a substrate; a reflective layer disposed on the substrate; a light source passing through the reflective layer and disposed on the substrate; a resin layer disposed on the reflective layer; and an optical pattern disposed on the resin layer, wherein the light source includes a first light emitting device and a second light emitting device spaced apart from the first light emitting device, wherein the first light emitting device and the second light emitting device may include a different number of LED chips, and the length of the long axis direction of the first light emitting device may be different from a length of the long axis direction of the second light emitting device.

According to an embodiment of the invention, the first light emitting device includes a first lead frame, and a second lead frame and a third lead frame disposed on both sides of the first lead frame and having the same area from each other. The second lighting device may include a fourth lead frame and a fifth lead frame having a different area from the fourth lead frame. According to an embodiment of the invention, the first light emitting device includes a body to which the first to third lead frames are coupled to a bottom of a cavity; and a plurality of LED chips on the first lead frame disposed in the first cavity, wherein the cavity is disposed on a front surface of the body, the body including a first side portion facing the substrate, each of the first to third lead frames may include a bonding portion bent to the first side portion of the body. According to an embodiment of the invention, the second light emitting device may include a second body in which fourth and fifth lead frames are disposed to a bottom of the second cavity; at least one LED chip disposed on the fourth lead frame disposed on the bottom of the second cavity; a bonding member bonding between the fourth lead frame and the LED chip; and a first wire having both ends connected between the bonding member and the fourth lead frame. According to an embodiment of the invention, a second wire connecting the fifth lead frame and the LED chip of the second light emitting device is included, wherein the second wire may include a sub-wire having multi-stage contacts on the upper surface of the fifth lead frame.

A lighting device according to an embodiment of the invention includes: a substrate; a reflective layer disposed on the substrate; a light source passing through the reflective layer and disposed on the substrate; a resin layer disposed on the reflective layer; and an optical pattern disposed on the resin layer, wherein the light source includes M first light emitting devices and N second light emitting devices spaced apart from the M first light emitting devices, wherein M is a natural number greater than N, the length of the long axis of the first light emitting device is greater than the length of the long axis of the second light emitting device, and the maximum width of the resin layer overlapping in the long axis direction of the second light emitting device passing over the center of the second light emitting device may be in the range of 2 to 2.2 times the length of the long axis of the first light emitting device.

According to an embodiment of the invention, the resin layer may include: a first region having a minimum first width and in which a plurality of the first light emitting devices are arranged; and a second region having a maximum second width and in which at least one second light emitting device is disposed, wherein the second width is smaller than the first width and greater than a length in a long axis direction of the second light emitting device, wherein the second width is less than 2.2 times the length of the long axis of the second light emitting device, the second region has the second width, and may extend to a length of 5 times or more of a width of the short axis of the second light emitting device from the second light emitting device in the light exit direction of the second light emitting device. According to an embodiment of the invention, the second light emitting device may be disposed at a position closest to the side surface of the resin layer among the first and second light emitting devices. According to an embodiment of the invention, the optical pattern may include: a first optical pattern overlapping a portion of each of the first light emitting devices in a vertical direction; and a second optical pattern overlapping a portion of the second light emitting device in a vertical direction, wherein the second optical pattern may be disposed most adjacent to a side surface of the resin layer among the first and second optical patterns.

Advantageous Effects

According to an embodiment of the invention, it is possible to illuminate an edge region having a relatively narrow width in a lighting module with a uniform light distribution. According to an embodiment of the invention, by disposing a light emitting device having a relatively small length in an edge region having a relatively narrow width in the lighting module, it is possible to provide uniform surface illumination for regions having different widths.

According to an embodiment of the invention, it is possible to provide uniform surface illumination over the entire region of the resin layer by using light emitting devices of light sources having different lengths. According to an embodiment of the invention, by disposing optical patterns of different areas on the light emitting devices of the light source having different sizes, it is possible to suppress hot spots on the entire region of the resin layer. According to an embodiment of the invention, it is possible to improve the reliability of the lighting module and the lighting device having various shapes.

BEST MODE

Figure 1:
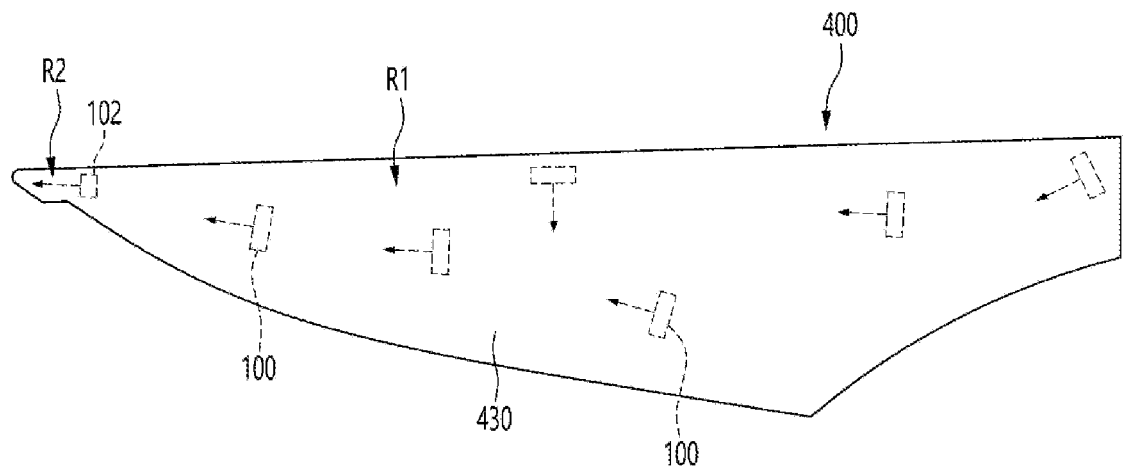
FIGS. 1 and 2 are examples of a plan view of a lighting device according to an embodiment of the invention.

Hereinafter, preferred embodiments of the invention will be described in detail with reference to the accompanying drawings.

The technical spirit of the invention is not limited to some embodiments to be described, and may be implemented in various other forms, and one or more of the components may be selectively combined and substituted for use within the scope of the technical spirit of the invention. In addition, the terms (including technical and scientific terms) used in the embodiments of the invention, unless specifically defined and described explicitly, may be interpreted in a meaning that may be generally understood by those having ordinary skill in the art to which the invention pertains, and terms that are commonly used such as terms defined in a dictionary should be able to interpret their meanings in consideration of the contextual meaning of the relevant technology. Further, the terms used in the embodiments of the invention are for explaining the embodiments and are not intended to limit the invention. In this specification, the singular forms also may include plural forms unless otherwise specifically stated in a phrase, and in the case in which at least one (or one or more) of A and (and) B, C is stated, it may include one or more of all combinations that may be combined with A, B, and C. In describing the components of the embodiments of the invention, terms such as first, second, A, B, (a), and (b) may be used. Such terms are only for distinguishing the component from other component, and may not be determined by the term by the nature, sequence or procedure etc. of the corresponding constituent element. And when it is described that a component is "connected", "coupled" or "joined" to another component, the description may include not only being directly connected, coupled or joined to the other component but also being "connected", "coupled" or "joined" by another component between the component and the other component. In addition, in the case of being described as being formed or disposed "above (on)" or "below (under)" of each component, the description includes not only when two components are in direct contact with each other, but also when one or more other components are formed or disposed between the two components. In addition, when expressed as "above (on)" or "below (under)", it may refer to a downward direction as well as an upward direction with respect to one element. The lighting device according to the invention may be applied to various lamp devices that require lighting, such as vehicle lamps, home lighting devices, or industrial lighting devices. For example, when applied to vehicle lamps, it is applicable to headlamps, sidelights, side mirrors, fog lights, tail lamps, brake lights, daytime running lights, vehicle interior lights, door scars, rear combination lamps, backup lamps, etc. The lighting device of the invention may be applied to indoor and outdoor advertising devices, display devices, and various electric vehicle fields, and in addition, it may be applied to all lighting-related fields or advertisement-related fields that are currently developed and commercialized or that may be implemented according to future technological developments.

Figure 2:
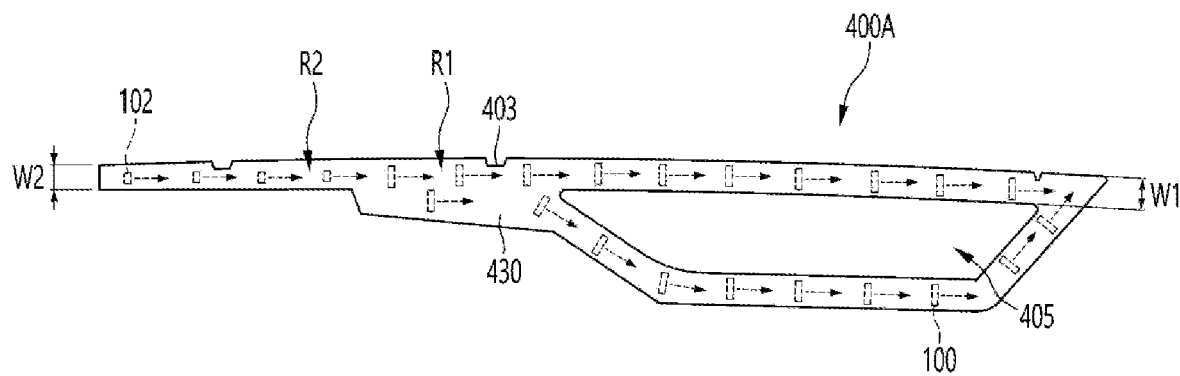
Figure 3:
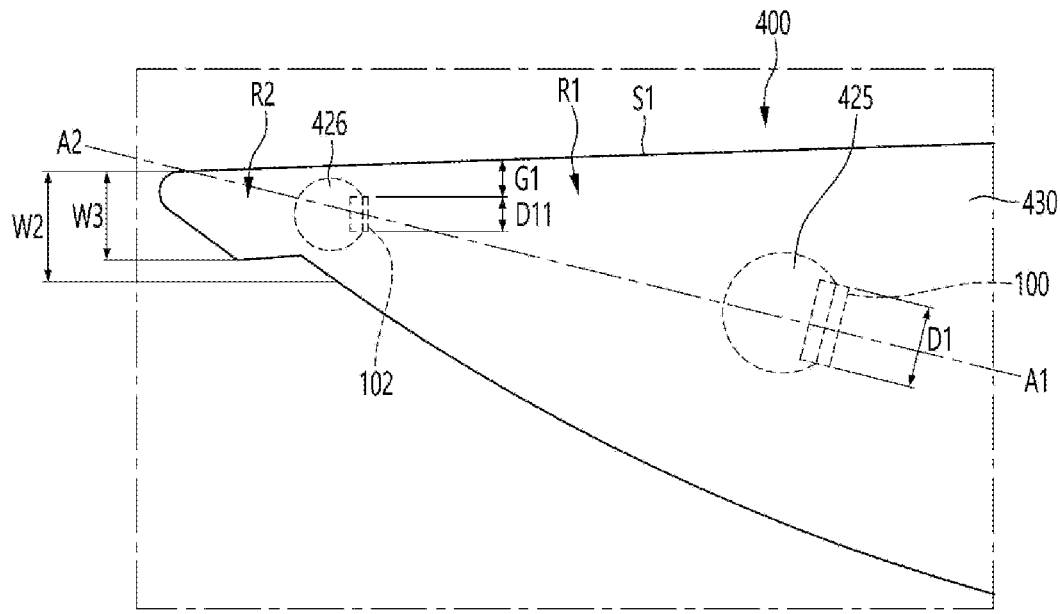
FIG. 3 is a partially enlarged view of the lighting device of FIG. 1.
Figure 4:
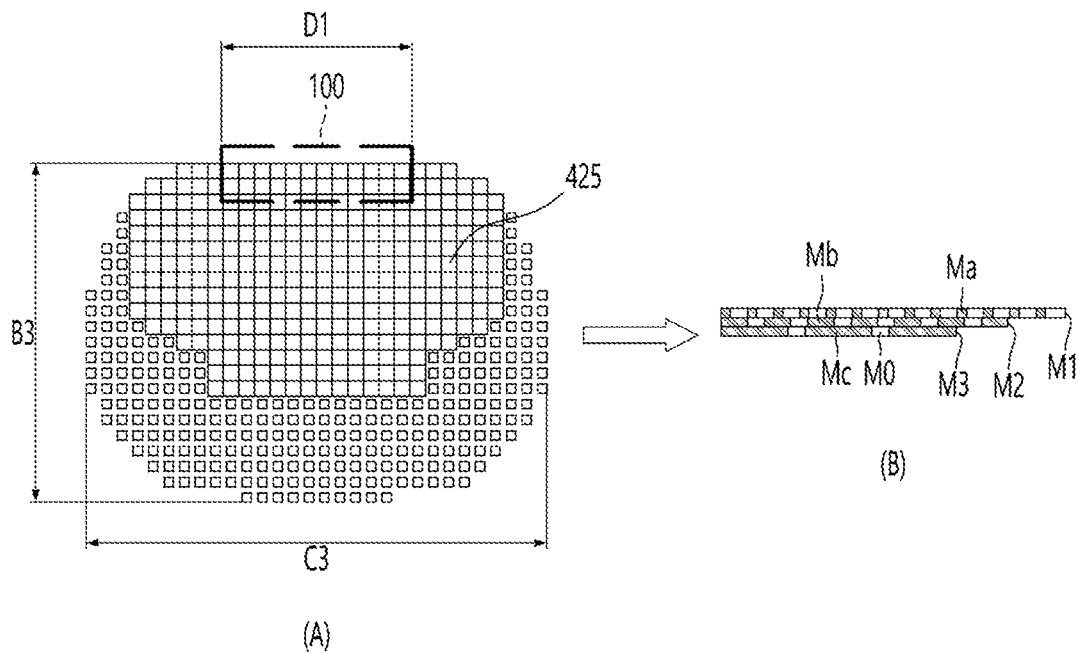
FIGS. 4 (A) and (B) are examples of a plan view and a cross-sectional side view of the first optical pattern of FIG. 3.
Figure 5:
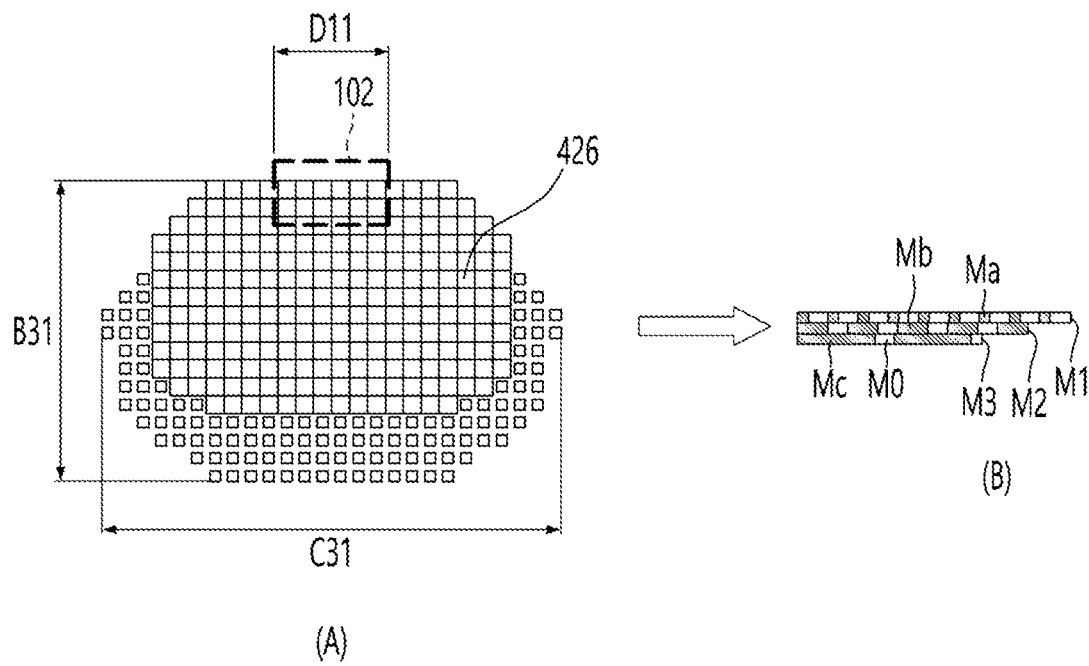
FIGS. 5 (A) and (B) are examples of a plan view and a cross-sectional side view of the first optical pattern of the second optical pattern of FIG. 3.
Figure 6:
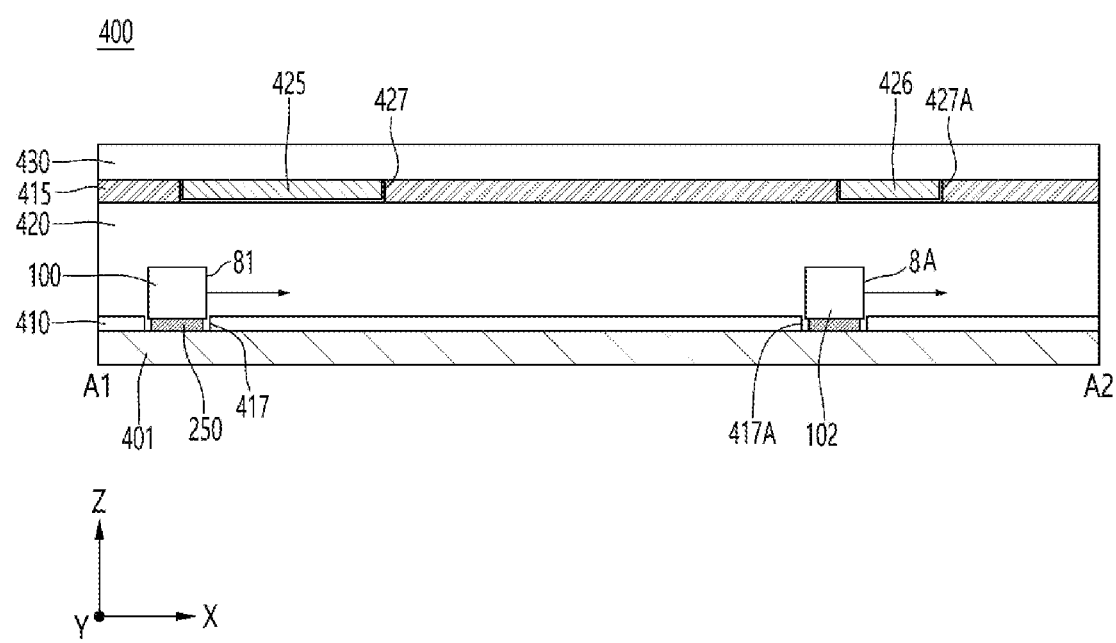
FIG. 6 is a side cross-sectional view taken along line A1-A2 of the lighting device of FIG. 3.
Figure 7:
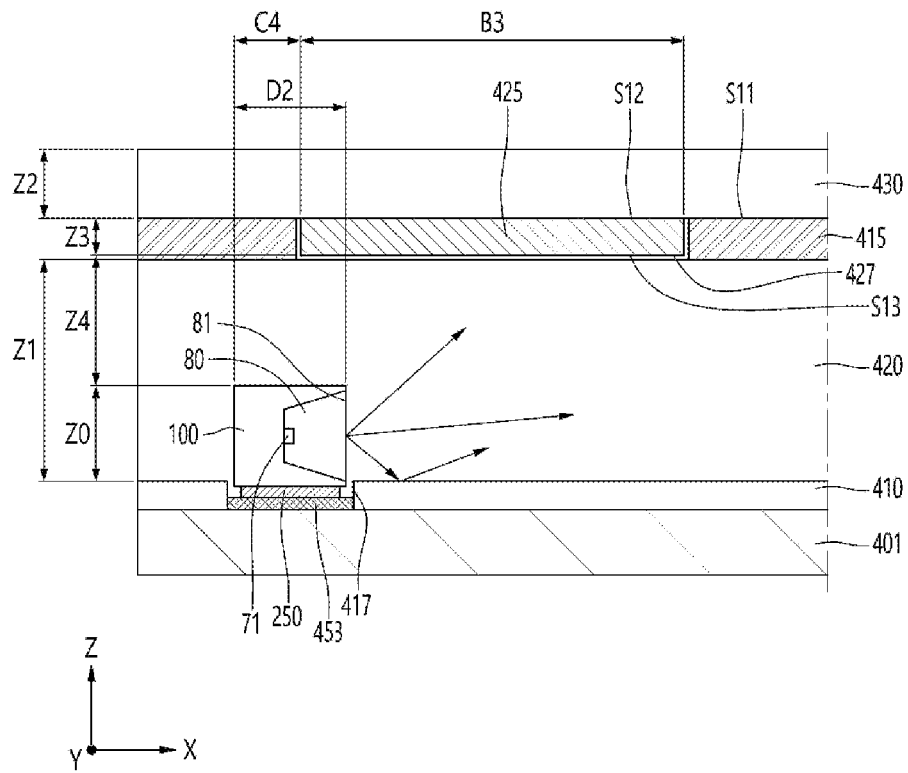
FIG. 7 is a partially enlarged view of the lighting module in FIG. 6.
Figure 8:
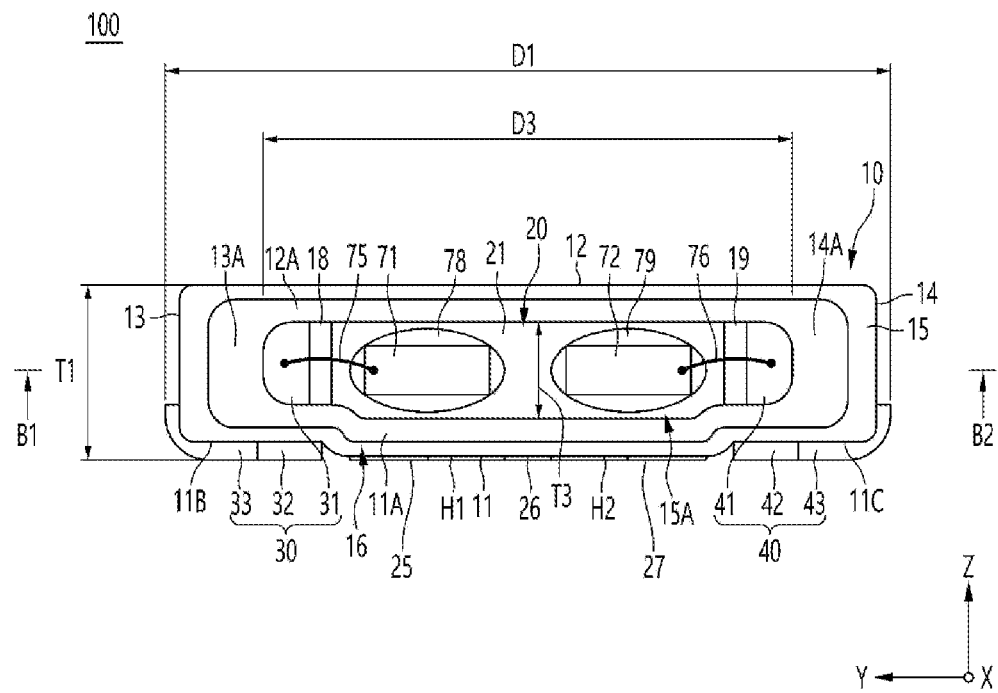
FIG. 8 is an example of a front view of a first light emitting device of a lighting device according to an embodiment of the invention.
Figure 9:
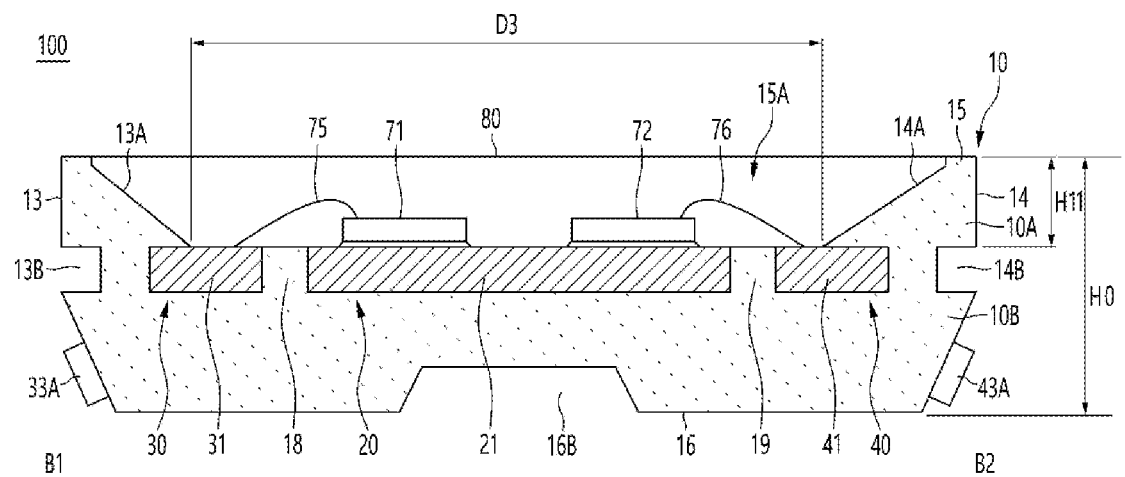
FIG. 9 is an example of a cross-sectional view taken along line B1-B2 of the first light emitting device of FIG. 8.
Figure 10:
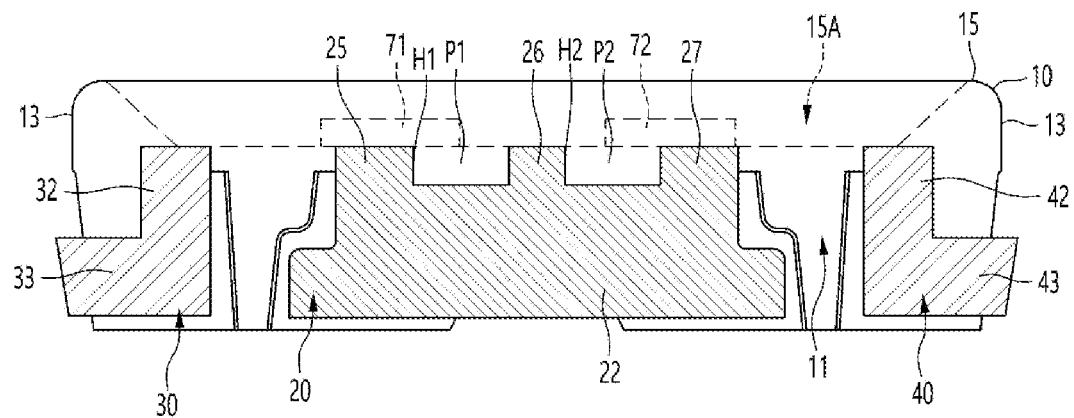
FIG. 10 is an example of a bottom view of the first light emitting device of FIG. 8.
Figure 11:
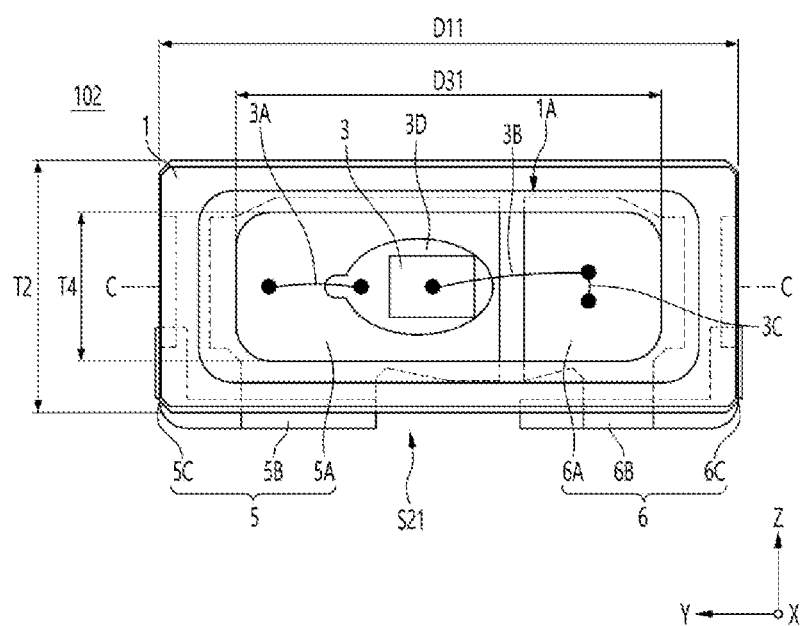
FIG. 11 is an example of a front view of a second light emitting device of a lighting device according to an embodiment of the invention.
Figure 12:
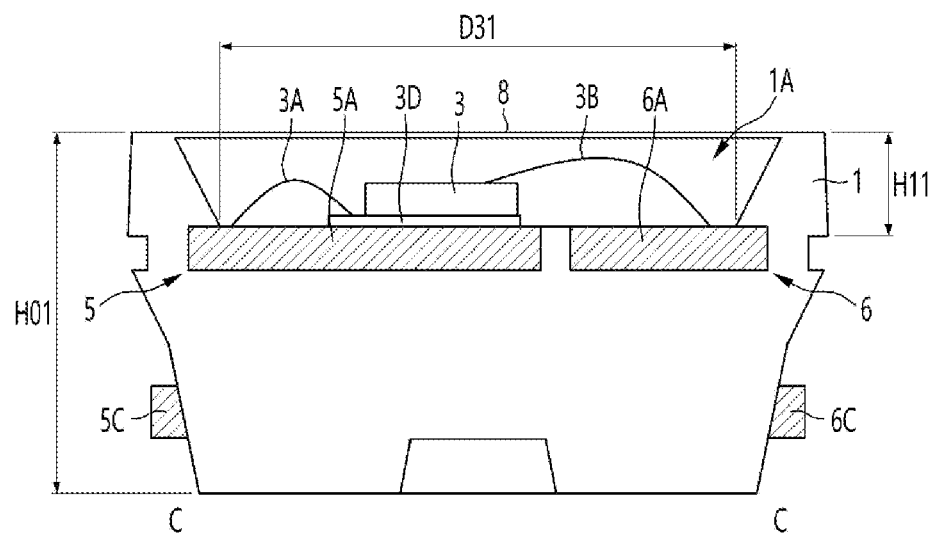
FIG. 12 is an example of a cross-sectional view taken along the line C-C of the second light emitting device of FIG. 11.
Figure 13:
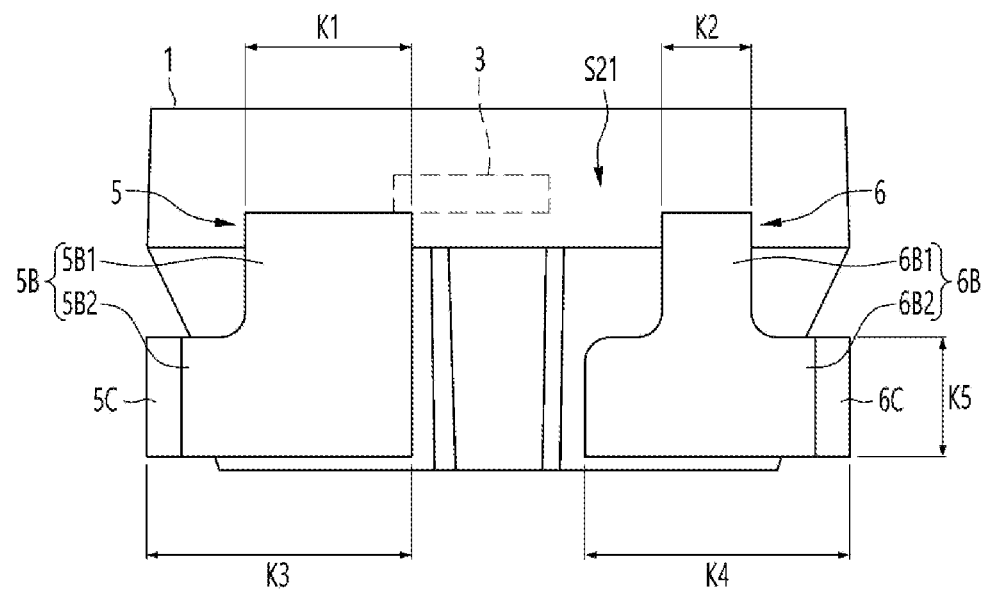
FIG. 13 is an example of a bottom view of the second light emitting device of FIG. 11.
Figure 14:
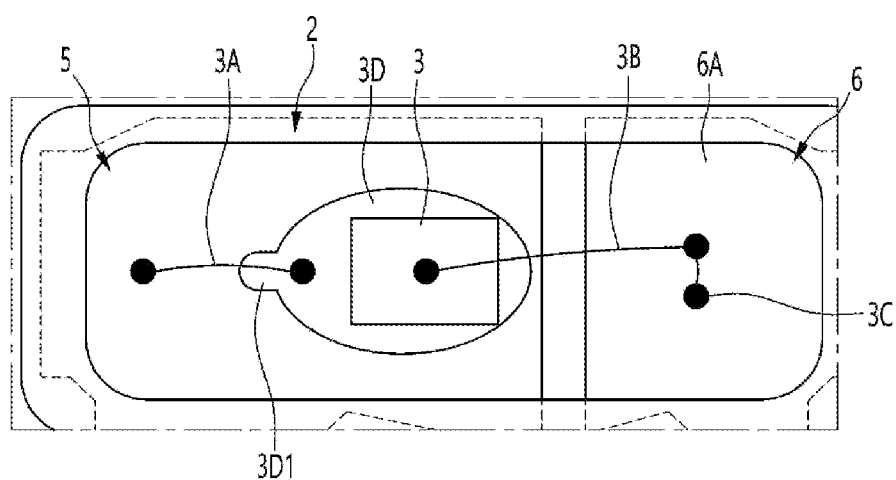
FIG. 14 is a partially enlarged view of the second light emitting device of FIG. 11.
Figure 15:
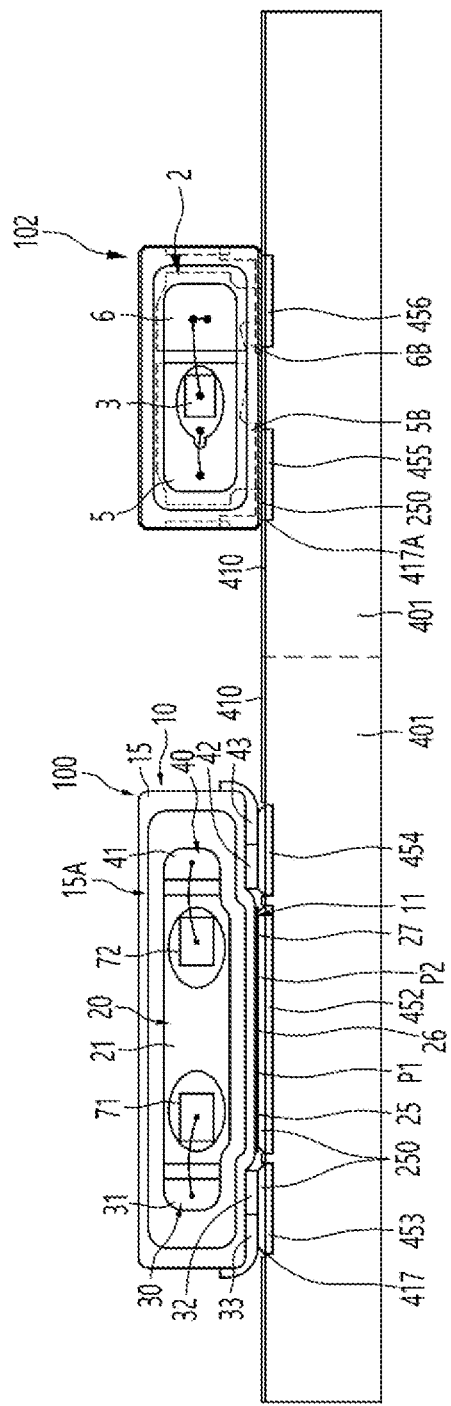
FIG. 15 is a view comparing first and second light emitting devices of a substrate according to an embodiment of the invention.

FIGS. 1 and 2 are examples of a plan view of a lighting device according to an embodiment of the invention, FIG. 3 is a partially enlarged view of the lighting device of FIG. 1, FIG. 4(A)(B) is examples of a plan view and a cross-sectional side view of the first optical pattern of FIG. 3, FIG. 5(A)(B) is examples of a plan view and a cross-sectional side view of the first optical pattern of the second optical pattern of FIG. 3, FIG. 6 is a side cross-sectional view taken along line A1-A2 of the lighting device of FIG. 3, FIG. 7 is a partially enlarged view of the lighting module in FIG. 6, FIG. 8 is an example of a front view of a first light emitting device of a lighting device according to an embodiment of the invention, FIG. 9 is an example of a cross-sectional view taken along line B1-B2 of the first light emitting device of FIG. 8, FIG. 10 is an example of a bottom view of the first light emitting device of FIG. 8, FIG. 11 is an example of a front view of a second light emitting device of a lighting device according to an embodiment of the invention, FIG. 12 is an example of a cross-sectional view taken along the line C-C of the second light emitting device of FIG. 11, FIG. 13 is an example of a bottom view of the second light emitting device of FIG. 11, FIG. 14 is a partially enlarged view of the second light emitting device of FIG. 11, and FIG. 15 is a view comparing first and second light emitting devices of a substrate according to an embodiment of the invention.

Referring to FIGS. 1 to 7, a lighting device 400 according to an embodiment of the invention may include a light source having a plurality of light emitting devices 100 and 102. At least one of the light emitting devices 100 and 102 may have a length different from that of the other light emitting devices. At least one of the light emitting devices 100 and 102 may have a size or volume smaller than that of the other light emitting devices. At least one of the light emitting devices 100 and 102 may have an area of an emission surface that is different from an area of an emission surface of the other light emitting devices. At least one of the light emitting devices 100 and 102 may have an area of an emission surface smaller than an area of an emission surface of the other light emitting device.

As shown in FIG. 1, in the lighting device 400, a diffusion layer 430 is disposed on an upper portion, a plurality of first light emitting devices 100 are arranged in a first region R1, and at least one second light emitting device 102 may be disposed in a second region R2 that is a corner region. The first light emitting devices 100 may emit light in the same direction or in at least one different direction. The second light emitting device 102 may be disposed at a position closest to the outer side surface S1 or at the closest distance among the first and second light emitting devices 100 and 102. As shown in FIG. 3, the minimum distance G1 between the second light emitting device 102 and the outer side surface S1 may be in the range of 2 times or less, for example, 0.5 to 1.5 times the length D11 of the second light emitting device 102.

As shown in FIGS. 2 and 3, in the lighting device 400A, a diffusion layer 430 is disposed on an upper portion or a resin layer 420 (see FIG. 5) is disposed on a lower portion, and a plurality of the first light emitting devices 100 are arranged in a first regions R1 a width having greater than or equal to a first width W1, and a plurality of second light emitting devices 102 may be arranged in the second region R2 having a thin second width W2. The second region R2 may extend to a width W3 smaller than the second width W2 in the emission side direction of the second light emitting device 102. One or a plurality of coupling grooves 403 may be disposed around the lighting device 400A, and a through hole 405 larger than an interval between the plurality of first light emitting devices 100 may be disposed in the lighting device 400A.

As shown in FIGS. 1 and 2, when viewed from the top view of the lighting devices 400 and 400A, the first light emitting device 100 is disposed in the first region R1 having a length of at least the first width W1 or more; The second light emitting device 102 may be disposed in the second region R2 having a maximum length of the second width W2. The first width W1 may be the width of the substrate 401 or the resin layer 420 disposed on the substrate 401 in the first region R1, and the second width W2 may be a width of the substrate 401 or the resin layer 420 disposed on the substrate 401 in the second region R2. The first width W1 may be three or more times the length D1 of the first light emitting device 100 in the first region R1. The second width W2 may be 2.2 times or less, for example, in the range of 2 to 2.2 times the length D1 of the first light emitting device 101 in the second region R2. The second region R2 has a maximum width W2 on the resin layer 420 overlapping in the long axis direction of the second light emitting device 102 passing over the center of the second light emitting device 102, and the maximum width W2 of the second region R2 may be 2.2 times or less, for example, in the range of 2 to 2.2 times the length of the long axis of the first light emitting device 100. The first and second regions R1 and R2 may be regions in which the substrate 401 and/or the resin layer 420 has the second width W2. The lengths D1 and D11 of the first and second light emitting devices 100 and 102 may be lengths in the long axis direction.

In the lighting devices 400 and 400A, even if the width of the edge portion having the second region R2 is narrow in the lamp structure of various shapes, one or a plurality of the second light emitting devices 102 may be disposed and the distribution of surface light on the entire region of the lighting device 400 and 400A may be provided uniformly. Here, the length in the direction in which light is emitted from the second light emitting device 102 in the second region R2 may have a long length that is 5 times or more than a width H01 (Refer to FIG. 12) of the short axis of the second light emitting device 102, and at least one second light emitting device 102 may be disposed along the second region R2. Here, the first light emitting devices 100 may be arranged on the substrate 401 in at least one row in the second direction Y, or may be arranged in two or more rows, and the first light emitting devices 100 arranged in one or more rows or two or more rows may be disposed in the first direction X of the substrate 401 or may be disposed in different directions. The first light emitting device 100 may be arranged in an m×n matrix, and m, n may be an integer of 2 or more.

As shown in FIGS. 3 and 6, the lighting device 400 may include a light source having a plurality of light emitting devices 100 and 102 and a resin layer 420 covering the light source. The lighting device 400 may include a substrate 401 supporting the light emitting devices 100 and 102 and the resin layer 420. The lighting device 400 may include at least one of at least one diffusion layer 430, optical patterns 425 and 426, and/or a light-transmitting layer on the resin layer 420. The lighting device 400 may include a reflective layer 410 disposed between the substrate 401 and the resin layer 420. The lighting device 400 according to an embodiment of the invention may emit the light emitted from the light emitting devices 100 and 102 as surface light. The lighting device 400 may be defined as a light emitting cell or a light source module. The light source may include a plurality of arranged first light emitting devices 100 and at least one second light emitting device 102. The light source includes M first light emitting devices 100 and N second light emitting devices 102 spaced apart from the M first light emitting devices 100, wherein M and N are natural numbers, and it may have a relationship: M>N. The second light emitting device 102 may have a length D11 smaller than the length D1 of each of the first light emitting devices 100. An upper surface area of the second light emitting device 102 may be smaller than an upper surface area of each of the first light emitting devices 100. The area of the emission surface 8A of the second light emitting device 102 may be smaller than the area of the emission surface 81 of each of the first light emitting devices 100. The luminous intensity of the light emitted from the second light emitting device 102 may be lower than the luminous intensity of the light emitted from each of the first light emitting devices 100. The number of LED chips 3 (see FIG. 11) in the second light emitting device 102 may be different from the number of LED chips 71 and 72 disposed on at least one of the first light emitting devices 100, and for example, may be smaller than the number of LED chips 71 and 72 of the first light emitting device 100.

Hereinafter, each configuration of the lighting device 400 will be described with reference to FIGS. 7 and 8.

<Substrate 401>

Referring to FIGS. 6 and 7, the substrate 401 may include a printed circuit board (PCB). The substrate 410 may include, for example, at least one of a resin-based printed circuit board (PCB), a PCB having a metal core, a flexible PCB, a ceramic PCB, or an FR-4 substrate. When the substrate 401 is disposed as a metal core PCB having a metal layer disposed on the bottom, heat dissipation efficiency of the light emitting devices 100 and 102 may be improved. The substrate 401 may be electrically connected to the light emitting devices 100 and 102. The substrate 401 includes a wiring layer (not shown) thereon, and the wiring layer may be electrically connected to the light emitting devices 100 and 102. When a plurality of the light emitting devices 100 and 102 are arranged on the substrate 401, the plurality of light emitting devices 100 and 102 may be connected in series, parallel, or series-parallel by the wiring layer. The substrate 401 may function as a base member or a support member disposed under the light emitting devices 100 and 102 and the resin layer 420. Here, the first and second light emitting devices 100 and 102 may be driven separately from each other. The upper surface of the substrate 401 may have an X-Y plane. The upper surface of the substrate 401 may be flat or have a curved surface. The thickness of the substrate 401 may be a height in a vertical direction or a Z direction. Here, in the X-Y plane, the X direction may be a first direction, and the Y direction may be a second direction. The Z direction may be a direction orthogonal to the first and second directions X and Y. The plurality of first light emitting devices 100 may be arranged at a constant pitch in a direction in which light is emitted on the substrate 401, but is not limited thereto. The substrate 401 may be provided in a straight or curved bar shape in a long length direction. The substrate 401 may include a light-transmitting material through which light is transmitted through the upper and lower surfaces. The light-transmitting material may include at least one of polyethylene terephthalate (PET), polystyrene (PS), and polyimide (PI). The substrate 401 may include, for example, a reflective layer 410. The reflective layer 410 may be an insulating layer that protects a circuit pattern having a pad disposed on the substrate 401 or a layer of a reflective material.

<Light Emitting Device 100 and 102>

Referring to FIGS. 1 to 5, the light emitting devices 100 and 102 are disposed on the substrate 401 and emit light in the first direction X. The light emitting devices 100 and 102 emit light having the highest intensity through the emission surfaces 81 and 8A. The light emitting devices 100 and 102 may have emission surfaces 81 and 8A through which light is emitted, and the emission surfaces 81 and 8A are disposed, for example, in the third direction Z or a vertical direction with respect to the horizontal upper surface of the substrate 401. The emission surfaces 81 and 8A may be a vertical plane, or may include a concave surface or a convex surface. As shown in FIG. 15, the first light emitting device 100 may be bonded to, for example, first and second pads 453, 454 disposed on the substrate 401 using a bonding member 250, and the second light emitting device 102 may be bonded to the third and fourth pads 455 and 456 using a bonding member 250. The first and second light emitting devices 100 and 102 may be electrically connected to the substrate 401. The bonding member 250 is a conductive material, and may be a solder material or a metal material. The light emitting devices 100 and 102 may emit at least one of blue, red, green, ultraviolet (UV), and infrared rays, and the light emitting devices 100 and 102 may include an LED chip emitting at least one of white, blue, red, green, and infrared rays. The light emitting devices 100 and 102 may be of a side view type in which a bottom portion is electrically connected to the substrate 401, but is not limited thereto. As another example, the light emitting devices 100 and 102 may be an LED chip or a top-view package. Some of the light emitted through the emission surfaces 81 and 8A of the light emitting devices 100 and 102 may travel in a direction parallel to the upper surface of the substrate 401, reflect by the reflective layer 410 or and travels in a direction of the upper surface of the resin layer 420.

As shown in FIGS. 8 and 9, the length D1 of the first light emitting device 100 in the second direction Y may be greater than the width H0 in the first direction X. For example, in the first light emitting device 100, the length D1 may be at least twice the width H0, for example, between 3 times and 4.2 times. Since the first light emitting device 100 has a long length in the second direction Y, the light emission surface of the light emitting device 110 in the first direction X orthogonal to the second direction Y may have a larger area, and may illuminate a larger area.

As shown in FIGS. 11 and 12, the length D11 of the second light emitting device 102 in the second direction Y may be greater than the width H01 in the first direction X. For example, in the second light emitting device 102, the length D11 may be less than or equal to twice the width H01, for example, in the range of 1.4 to 2 times. The width H01 of the second light emitting device 102 is provided to be greater than or equal to a certain level, and a long length D11 in the second direction Y is provided to be smaller than the length D1 of the first light emitting device 100, so that a region having a narrow width may be illuminated.

As shown in FIGS. 8 and 11, the thicknesses T1 and T2 of the light emitting devices 100 and 102 may be, for example, 3 mm or less, for example, in the range of 0.8 mm to 2 mm. The thickness T1 of the first light emitting device 100 may be in the range of 1.3 mm to 1.5 mm, and the thickness T2 of the second light emitting device 102 may be formed to be equal to or thicker than the thickness T1 of the first light emitting device 100, and for example, may be in the range of 1.4 mm to 1.55 mm. The thickness T1 of the first light emitting device 100 and the thickness T2 of the second light emitting device 102 are vertical heights, and the difference between the thicknesses T1 and T2 may be in the range of 0.5 mm to 0.9 mm. Since the size of the second light emitting device 102 is relatively small, it is possible to provide a thicker body 1 and the body 1 is stably coupled to the lead frames 5 and 6. The length D1 in the second direction Y of the first light emitting device 100 may be 3 times or more, for example, in the range of 3 to 5 times the thickness T1 of the first light emitting device 100. The length D11 of the second light emitting device 102 in the second direction Y may be 3 times or less of the thickness T2 of the second light emitting device 102, for example, in the range of 2 to 3 times.

<Reflective Layer 410>

As shown in FIGS. 6 and 7, the reflective layer 410 may be a layer separately disposed on the substrate 401 or a layer protecting the upper portion of the substrate 401. The reflective layer 410 may be disposed between, for example, the substrate 401 and the resin layer 420. The reflective layer 410 may be provided in the form of a film having a metal material or a non-metal material. The reflective layer 410 may be adhered to the upper surface of the substrate 401. The reflective layer 410 may have an area smaller than a upper surface area of the substrate 401. The reflective layer 410 may be spaced apart from the edge of the substrate 401, and a resin layer 420 may be attached to the substrate 401 in the spaced apart region. In this case, it is possible to prevent the edge portion of the reflective layer 410 from peeling off. The reflective layer 410 may include holes 417 and 417A in which lower portions of the light emitting devices 100 and 102 are disposed. In the holes 417 and 417A of the reflective layer 410, the upper surface of the substrate 401 is exposed and a portion to which the lower portions of the light emitting devices 100 and 102 are bonded may be disposed. The size of the holes 417 and 417A may be the same as or larger than the size of the light emitting devices 100 and 102, but is not limited thereto. The first hole 417 in which the first light emitting device 100 is disposed may be larger than the second hole 417A in which the second light emitting device 102 is disposed, and for example, an area of the first hole 417 may be 1.5 times or more, for example, in a range of 1.5 times to 2.2 times the area of the second hole 417A. The length of the first hole 417 in the long axis direction may be 2.4 times or more, for example, in the range of 2.4 times to 2.6 times the length of the long axis direction of the second hole 417A. Due to the difference in length or area, the first and second light emitting devices 100 and 102 may be easily accommodated in the respective holes 417 and 417A, and the problem of exposing the bonding member 250 to the outside may be reduced.

The reflective layer 410 may be in contact with the upper surface of the substrate 401 or may be adhered between the resin layer 420 and the substrate 401, but is not limited thereto. Here, the reflective layer 410 may be removed when a highly reflective material is coated on the upper surface of the substrate 401. The reflective layer 410 may be formed to have a thickness smaller than that of the light emitting devices 100 and 102. The thickness of the reflective layer 410 may include a range of 0.2 mm±0.02 mm. The lower portions of the light emitting devices 100 and 102 may penetrate through the holes 417 and 417A of the reflective layer 410 and upper portions of the light emitting devices 100 and 102 may protrude. The emission surfaces 81 and 8A of the light emitting devices 100 and 102 may be provided in a direction perpendicular to the upper surface of the reflective layer 410.

The reflective layer 410 may include a metallic material or a non-metallic material. The metallic material may include a metal such as aluminum, silver, or gold. The non-metallic material may include a plastic material or a resin material. The resin material may include a reflective material, for example, a metal oxide such as $TiO_2$, $Al_2O_3$, $SiO_2$, in silicon or epoxy. The reflective layer 410 may be implemented as a single layer or a multilayer, and light reflection efficiency may be improved by such a layer structure. The reflective layer 410 according to an embodiment of the invention reflects the incident light, thereby increasing the amount of light so that the light is emitted with a uniform distribution. As another example of the lighting device, the reflective layer 410 may be removed from the substrate 401. For example, the resin layer 420 may be disposed on the substrate 401 without the reflective layer 410, and the resin layer 420 may be in contact with the upper surface of the substrate 401.

<Resin Layer 420>

The resin layer 420 may be disposed on the substrate 401. The resin layer 420 may face or adhere to the substrate 401. The resin layer 420 may be disposed on all or a portion of the upper surface of the substrate 401. A lower surface area of the resin layer 420 may be equal to or smaller than an upper surface area of the substrate 401. The resin layer 420 may be formed of a transparent material and may guide or diffuse light. The resin layer 420 may be formed of a resin-based material, and may include a resin material such as silicone or epoxy, or a UV-curable resin material. Such a resin material can be used instead of the light guide plate, and it is convenient to adjust the refractive index and adjust the thickness. In addition, the resin layer 420 uses the above-described oligomer as a main material, and mixes IBOA, diluent monomer, and GMA to control hardness, heat resistance, transmittance, and suppress adhesion and oxidation prevention. The resin layer 420 may contain a photo initiator and a light stabilizer to control curing and suppress discoloration.

Since the resin layer 420 is provided as a layer for guiding light as a resin, it may be provided with a thinner thickness than that of glass and may be provided as a flexible plate. The resin layer 420 may emit the point light source emitted from the light emitting devices 100 and 102 in the form of a line light source or a surface light. A bead (not shown) may be included in the resin layer 420, and the bead may diffuse and reflect incident light to increase the amount of light. The beads may be arranged in an amount of 0.01 to 0.3% based on the weight of the resin layer 420. The bead may be composed of any one selected from silicon, silica, glass bubble, polymethyl methacrylate (PMMA), urethane, Zn, Zr, $Al_2O_3$, and acryl, and the particle diameter of the beads may be in the range of about 1 μm to about 20 μm, but is not limited thereto. Since the resin layer 420 is disposed on the light emitting devices 100 and 102, it is possible to protect the light emitting devices 100 and 102 and reduce loss of light emitted from the light emitting devices 100 and 102. The light emitting devices 100 and 102 may be buried under the resin layer 420.

The resin layer 420 may be in contact with the surfaces of the light emitting devices 100 and 102 and may be in contact with the emission surfaces 81 and 8A of the light emitting devices 100 and 102. A portion of the resin layer 420 may be disposed in the holes 417 and 417A of the reflective layer 410. A portion of the resin layer 420 may be in contact with the upper surface of the substrate 401 through the holes 417 and 417A of the reflective layer 410. Accordingly, a portion of the resin layer 420 is in contact with the substrate 401, thereby fixing the reflective layer 410 between the resin layer 420 and the substrate 401.

Referring to FIG. 7, the thickness Z1 of the resin layer 420 may be 1.8 mm or more, for example, in the range of 1.8 to 2.5 mm. When the thickness Z1 of the resin layer 420 is thicker than the above range, the luminous intensity may be reduced, and it may be difficult to provide a flexible module due to an increase in the module thickness. When the thickness Z1 of the resin layer 420 is smaller than the above range, it is difficult to provide surface light having a uniform luminous intensity. A length in the first direction X of the resin layer 420 may be the same as a length in the first direction X of the substrate 401, and a width in the second direction Y of the resin layer 420 may be equal to the width Y1 of the substrate 401 in the second direction Y. Accordingly, each side surface of the resin layer 420 may be disposed on the same plane as each side surface of the substrate 401. The resin layer 420 may be provided in a size to cover the plurality of light emitting devices 100 and 102 or may be connected to each other. The resin layer 420 may be divided into a size to cover each of the light emitting devices 100 and 102. The upper surface of the resin layer 420 may have a first adhesive force. The upper surface of the resin layer 420 may have a first adhesive force and may be adhered to the light-transmitting layer 415.

<Light-Transmitting Layer 415>

The light-transmitting layer 415 may be an adhesive material such as silicone or epoxy, or may include a diffusion material. The diffusion material may include at least one of polyester (PET), poly methyl methacrylate (PMMA), and polycarbonate (PC). The light-transmitting layer 415 may include an adhesive region that is adhered to the upper surface of the resin layer 420 and a non-adhesive region that is not adhered or spaced apart from the upper surface of the resin layer 420. The light-transmitting layer 415 is disposed on 60% or more, for example, 80% or more, of the upper surface area of the resin layer 420, so that the diffusion layer 430 is in close contact with the resin layer 420 or when the lower diffusion layer (not shown) disposed between the light-transmitting layer 415 and the resin layer 420, the diffusion layer 430 may be in close contact with the lower diffusion layer (not shown).

<Optical Patterns 425 and 426>

The optical patterns 425 and 426 may face the upper surface of the resin layer 420. The optical patterns 425 and 426 may overlap each of the light emitting devices 100 and 102 in a vertical direction or a third direction Z. Each of the plurality of optical patterns 425 and 426 may be vertically overlapped with each of the plurality of light emitting devices 100 and 102. The optical patterns 425 and 426 may be disposed between the resin layer 420 and the diffusion layer 430. When the diffusion layer 430 is disposed in plurality, the optical patterns 425 and 426 may be disposed on the lower surface of the plurality of diffusion layers or between the plurality of diffusion layers. The optical patterns 425 and 426 may be disposed in the light-transmitting layer 415. The optical patterns 425 and 426 may penetrate the light-transmitting layer 415, and may contact at least one of the resin layer 420 and the diffusion layer 430. The optical patterns 425 and 426 may include gap portions 427 and 427A spaced apart from the inner surface of the light-transmitting layer 415 and/or the upper surface of the resin layer 420. The gap portions 427 and 427A may provide a refractive index different from that of the optical patterns 425 and 426, thereby improving light diffusion efficiency. For example, the lower surface S13 of the optical patterns 425 and 426 may be spaced apart from or in contact with the upper surface of the resin layer 420. The gap portions 427 and 427A may be an air region or a vacuum region.

As shown in FIGS. 3, 6, and 7, a distance between adjacent first optical patterns 425 may be smaller than a distance between adjacent first light emitting devices 100. A distance between the different first and second optical patterns 425 and 426 may be smaller than a distance between the different first and second light emitting devices 100 and 102. The optical patterns 425 and 426 may be spaced apart from the outer side surface S1 (refer to FIG. 3) of the resin layer 420. The optical patterns 425 and 426 may have the same shape as each other. The optical patterns 425 and 426 may be respectively disposed on the first and second light emitting devices 100 and 102. The first optical pattern 425 may overlap each of the first light emitting devices 100 in the vertical direction. The second optical pattern 426 may vertically overlap the second light emitting device 102. The second optical pattern 426 may be disposed at the closest distance or closest to the side surface of the resin layer 420 among the first and second optical patterns 425 and 426. The optical patterns 425 and 426 may be disposed higher than the upper surface of the resin layer 420. Each of the optical patterns 425 and 426 may be 50% or more of the upper surface area of each of the light emitting devices 100 and 102 on the light emitting devices 100 and 102, or may be in the range of 50% to 800%. The optical patterns 425 and 426 may be regions printed with a white material. The optical patterns 425 and 426 may be printed using, for example, a reflective ink including any one of $TiO_2$, $Al_2O_3$, $CaCO_3$, $BaSO_4$, and Silicon. The optical patterns 425 and 426 reflect the light emitted through the emission surfaces 81 and 8A of the light emitting devices 100 and 102, thereby reducing the occurrence of hot spots on each of the light emitting devices 100 and 102. The optical patterns 425 and 426 may be printed with a light blocking pattern using a light blocking ink. The optical patterns 425 and 426 may be formed by printing on the lower surface of the diffusion layer 430. The optical patterns 425 and 426 are made of a material that does not block 100% of amount of incident light, have transmittance lower than reflectance, and may function as light blocking and diffusion. The optical patterns 425 and 426 may be formed in a single layer or multiple layers, and may have the same pattern shape or different pattern shapes. The optical patterns 425 and 426 may have the same thickness as each other. The optical patterns 425 and 426 may have different thicknesses according to regions. The thickness of the optical patterns 425 and 426 may be the thickest in the center region and thinner in the edge region than the center region. The optical patterns 425 and 426 may have a thickness in proportion to the incident light intensity.

The lower surface area of the optical patterns 425 and 426 is arranged in 50% or more of the upper surface area of the light emitting devices 100 and 102, for example, in the range of 50% to 800% or in the range of 200% to 700% to block the incident light. Accordingly, it is possible to reduce the problem that the light emitting devices 100 and 102 are visible from the outside and to reduce hot spots on the region of the light emitting devices 100 and 102, thereby providing a uniform light distribution over the entire region. The optical patterns 425 and 426 may be disposed in a hemispherical shape, an elliptical shape, or a circular shape based on the light emitting devices 100 and 102.

As shown in FIG. 4(A), the first optical pattern 425 covers the emission side region of the upper surface of the first light emitting device 100, and may have a length C3 longer than the length D1 of the first light emitting device 100. The maximum length C3 of the first optical pattern 425 is the maximum length in a direction perpendicular to the direction in which light is emitted, and may be 8 mm or more, for example, in the range of 8 mm to 20 mm or in the range of 12 mm to 18 mm. The maximum width B3 of the first optical pattern 425 is the maximum length in the direction in which light is emitted, and may be provided in a range of 6 mm or more, for example, in the range of 6 mm to 15 mm or in the range of 8 mm to 13 mm. The maximum length C3 of the first optical pattern 425 may be smaller than the maximum width B3, for example, the maximum length C3 may be 1.2 times or more, for example, in the range of 1.2 times to 1.7 times the maximum width B3. Accordingly, the first optical pattern 425 disposed on the region from which the light of the first light emitting device 100 is emitted may suppress the hot spot through light blocking or reflection. The area of the first optical pattern 425 may vary according to the distribution of the orientation angle of the first light emitting device 102.

As shown in FIG. 5(A), the second optical pattern 426 covers the emission side region of the upper surface of the second light emitting device 102, and may have a length C31 longer than the length D11 of the second light emitting device 102. The length C31 of the second optical pattern 426 is the maximum length in a direction perpendicular to the direction in which the light is emitted, and may be 6 mm or more, for example, in the range of 6 mm to 15 mm or in the range of 6 mm to 12 mm. A width B31 of the second optical pattern 426 is a maximum length in a direction in which light is emitted, and may be provided in a range of 8 mm or more, for example, in the range of 8 mm to 18 mm or in the range of 8 mm to 15 mm. The length C31 of the second optical pattern 426 may be smaller than the width B31, for example, the length C31 may be formed in a range of 1.2 times or more, for example, in the range of 1.2 times to 1.7 times the width B31.

As shown in FIG. 4(A), the maximum length C3 of the first optical pattern 425 may be 2.6 times or less for example, in the range of 2.4 times to 2.6 times the length D1 of the first light emitting device 100 in the long axis direction Y. The maximum length C31 of the second optical pattern 426 may be 3.6 times or more, for example, in the range of 3.6 times to 3.8 times the length D11 of the second light emitting device 102 in the long axis direction Y. Accordingly, the second optical pattern 426 disposed on the region from which the light of the second light emitting device 102 is emitted may suppress the hot spot through light blocking or reflection. The area of the second optical pattern 426 may vary according to the distribution of the orientation angle of the second light emitting device 102. The length C31 of the second optical pattern 426 may be smaller than the length C3 of the first optical pattern 425, and may be, for example, in the range of 0.9 times or less, for example, in the range of 0.7 times to 0.9 times the length C3. The width B31 of the second optical pattern 426 may be smaller than the length B3 of the first optical pattern 425, and may be, for example, 0.85 times or less, for example, in the range of 0.68 times to 0.82 times the length B3.

As shown in FIGS. 4(A)(B) and 5(A)(B), the first and second optical patterns 425 and 426 may be stacked as a plurality of unit pattern layers M1, M2, and M3 and may include the same stacked structure. A portion of the first optical pattern 425 may be disposed on the first light emitting device 100, and a portion of the second optical pattern 426 may be disposed on the second light emitting device 102. The first and second optical patterns 425 and 426 may be stacked in the order of, for example, from the top to the bottom, the first unit pattern layer M1, the second unit pattern layer M2, and the third unit pattern layer M3. The second unit pattern layer M2 has an area smaller than the area of the first unit pattern layer M1, and the third unit pattern layer M3 or the lowermost pattern layer may be an area smaller than the area of the second unit pattern layer M2. The first to third unit pattern layers M1, M2, and M3 may be respectively overlapped on the first and second light emitting devices 100 and 102, and may be disposed to have a gradually smaller number of layers or a gradually thinner thickness as they go toward the emission side or in areas father from the light emitting devices 100 and 102. The first to third unit pattern layers M1, M2, and M3 have different pattern shapes and/or different areas from each other, and may overlap in a vertical direction. A reflective patterns Ma of the first unit pattern layer M1 have a size smaller than the size of a reflective patterns Mb of the second unit pattern layer M2, and may be arranged at a pitch smaller than the pitch of the reflection pattern Mb of the second unit pattern layer M2. The reflective patterns Mb of the second unit pattern layer M2 have a size smaller than the size of the reflective patterns Mc of the third unit pattern layer M3, and may be arranged at a pitch smaller than the pitch of the reflection pattern Mc of the third unit pattern layer M3. Here, the area of the first unit pattern layer M1 disposed on the uppermost side of the first optical pattern 425 may be greater than an area of the first unit pattern layer M1 disposed on the uppermost side of the second optical pattern 426. An adhesive material M0 such as silicone or epoxy may be filled in the reflective patterns Ma, Mb, Mc of the first to third unit pattern layers M1, M2, M3 of the first and second optical patterns 425 and 426. Since the first and second optical patterns 425 and 426 are stacked on the light emitting devices 100 and 102 as unit pattern layers M1, M2, and M3 having multi-layered reflective patterns Ma, Mb, and Mc, there is an effect of blocking light incident to the first and second optical patterns 425 and 426. In addition, since the first and second optical patterns 425 and 426 are provided to have a thinner thickness as the regions adjacent to the light emitting devices 100 and 102 are the thickest and the regions farther from the light emitting devices 101 and 102 are provided, it is possible to improve the difference in luminous intensity caused by the distance difference to a uniform luminous intensity.

As shown in FIG. 7, the thickness Z3 of the optical patterns 425 and 426 may be 0.1 times or less, for example, 0.05 times to 0.1 times the thickness Z1 of the resin layer 420. The thickness Z3 of the optical patterns 425 and 426 may be 100 μm or more, for example, in the range of 100 to 200 μm. When the thickness Z3 of the optical patterns 425 and 426 is smaller than the above range, there is a limit to reducing the hot spots, and when the thickness Z3 is larger than the above range, the optical uniformity may be deteriorated. The distance Z4 between the upper surfaces of the light emitting devices 100 and 102 and the lower surfaces of the optical patterns 425 and 426 may be 0.4 mm or more, for example, in the range of 0.4 mm to 0.6 mm. The distance Z0 between the upper surfaces of the light emitting devices 100 and 102 and the upper surface of the reflective layer 410 may be 0.8 mm or more, for example, in the range of 0.8 mm to 1.4 mm. Regions of the optical patterns 425 and 426 may not vertically overlap with regions of the light-transmitting layer 415.

The optical patterns 425 and 426 may be provided on each of the light emitting devices 100 and 102 with a size or area sufficient to prevent hot spots caused by light emitted in the emission direction of the light emitting devices 100 and 102. In addition, since the light emitting devices 100 and 102 emit light in the side direction, that is, in the first direction X, the optical patterns 425 and 426 cover a region capable of increasing light blocking efficiency due to the distribution of the light directivity angle of the light emitting devices 100 and 102 and the reflection characteristics of light.

Here, the distance between the first light emitting devices 100 or the distance between the first and second light emitting devices 100 and 102 may be 25 mm or more, for example, in the range of 25 mm to 30 mm, and may vary depending on the characteristics of the light emitting devices 100 and 102.

As another example, the optical patterns 425 and 426 may be an air region of a recess formed by an etching process of the upper surface of the resin layer 420, or may include a light blocking layer in which the light blocking material is disposed. Like the region of the optical pattern, the etched region may cover the emission surfaces of the light emitting devices 100 and 102 and may have a range of 50% to 800% of the upper surface area of the light emitting devices 100 and 102.

<Diffusion Layer 430>

The diffusion layer 430 may be disposed on the resin layer 420. A lower surface of the diffusion layer 430 may include a first region S11 in which the light-transmitting layer 415 is disposed and a second region S12 in which the optical patterns 425 and 426 are disposed. The diffusion layer 430 may have the optical patterns 425 and 426 printed thereon, and may be fixed on the resin layer 420 through the light-transmitting layer 415.

Here, when a lower diffusion layer (not shown) is disposed between the light transmitting layer 415 and the resin layer 420, the lower diffusion layer may be adhered to the resin layer 420, for example, the upper surface of the resin layer 420 may be adhered to the lower diffusion layer by a first adhesive force having fine cilia. In this case, the diffusion layer 430 and/or the lower diffusion layer may be attached to the resin layer 420 by applying a predetermined pressure or pressure/heat.

The diffusion layer 430 may include at least one of a polyester (PET) film, a poly methyl methacrylate (PMMA) material, or polycarbonate (PC). The diffusion layer 430 may be provided as a film made of a resin material such as silicone or epoxy. The diffusion layer 430 may include a single layer or multiple layers.

The thickness Z2 of the diffusion layer 430 is 25 μm or more, and may be, for example, in the range of 25 to 250 μm or in the range of 100 μm to 250 μm. The diffusion layer 430 may have the above thickness range and may provide incident light as uniform surface light. The diffusion layer 430 and/or the lower diffusion layer may include at least one or two or more of a diffusion agent such as beads, a phosphor, and ink particles. The phosphor may include, for example, at least one of a red phosphor, an amber phosphor, a yellow phosphor, a green phosphor, and a white phosphor. The ink particles may include at least one of metal ink, UV ink, and curing ink. The size of the ink particles may be smaller than the size of the phosphor. The surface color of the ink particles may be any one of green, red, yellow, and blue. The ink types may be selectively applied among PVC (Poly vinyl chloride) ink, PC (Polycarbonate) ink, ABS (acrylonitrile butadiene styrene copolymer) ink, UV resin ink, epoxy ink, silicone ink, PP (polypropylene) ink, water-based ink, plastic ink, PMMA (poly methyl methacrylate) ink and PS (Polystyrene) ink. The ink particles may include at least one of metal ink, UV ink, and curing ink.

In the embodiment of the invention, light diffused by the resin layer 420 may be transmitted through the light-transmitting layer 415 and may be emitted as surface light through the diffusion layer 430. In this case, the optical patterns 425 and 426 may prevent hot spots caused by incident light. In another example of the invention, a layer of a reflective material or an upper substrate may be disposed on the resin layer 420. The layer of the reflective material or the upper substrate may face the upper surface of the resin layer 420, the light emitting devices 100 and 102 are arranged in at least one row or column, and each emission surface 81 and 8A of the light emitting devices 100 and 102 may be disposed at the same distance as one side of the resin layer 420, and may emit light through one side of the resin layer 420.

Hereinafter, detailed structures of the first and second light emitting devices 100 and 102 will be described with reference to FIGS. 8 to 14. Referring to FIGS. 8 to 10, the first light emitting device 100 includes a body 10 having a cavity 15A, a plurality of lead frames 20, 30 and 40 in the cavity 15A, and the plurality of and a plurality of LED chips 71 and 72 disposed on at least one of the lead frames 20, 30, and 40. The first light emitting device 100 may be implemented as a side view type package, and may be applied to a mobile phone, a portable computer, various lighting fields, a vehicle lamp, or a pointing device. The length D2 in the first direction of the body 10 may be 4 mm or more, for example, in the range of 4 mm to 7 mm or in the range of 4.5 mm to 6.5 mm. Since the body 10 provides a long length D2 in the first direction, an emission-side area or a light-emitting area of the cavity 15A may be increased. The thickness T1 of the first light emitting device 100 may be 1.5 mm or less, for example, in the range of 0.6 mm to 1.5 mm. The first light emitting device 100 may provide a relatively thin thickness T1, thereby reducing the thickness of a lighting module or lamp having the first light emitting device 100.

The body 10 may be coupled to the lead frames 20, 30, and 40. The body 10 may be formed of an insulating material. The body 10 may be formed of a resin-based insulating material, for example, polyphthalamide (PPA), silicone-based, epoxy-based, or thermosetting resin including a plastic material, or a high heat resistance and high light resistance material. have. The body 10 may include a reflective material, for example, a resin material to which a metal oxide is added, and the metal oxide may include at least one of $TiO_2$, $SiO_2$, and $Al_2O_3$. To explain the side surfaces of the body 10, the body 10 may include the first side portion 11 and the second side portion 12 disposed on opposite sides in the thickness direction, and the third and fourth side portions 13 and 14 disposed on the opposite sides in the longitudinal direction. The first side portion 11 may be a bottom or a bottom surface of the body 10, and the second side portion 12 may be an upper surface of the body 10. The front portion 15 of the body 10 may be a surface on which the cavity 15A is disposed, and may be a surface on which light is emitted. The rear side opposite to the front portion 15 may be the rear side surfaces of the first side portion 11 and the second side portion 12. The body 10 may include a first body 10A in which the cavity 15A is disposed and a second body 10B on the rear side of the first body 10A. The first body 10A may be disposed on the front portion 15 rather than the lead frames 20, 30, and 40 and disposed around the cavity 15A. The second body 10B may be a part that supports the lead frames 20, 30, and 40 and supports the package.

The cavity 15A includes first to fourth inner side surfaces 11A, 12A, 13A, and 14A opposite to the first to fourth side surfaces 11, 12, 13, and 14, respectively, and the first to fourth inner side surfaces 11A, 12A, 13A, and 14A may be disposed to be inclined with respect to the bottom of the cavity 15A. As shown in FIG. 9, the depth H11 of the cavity 15A is a distance from the front portion 15 of the body 10 to the bottom of the cavity 15A, and may be in the range of, for example, 0.3 mm±0.05 mm. When the depth H11 of the cavity 15A is less than the above range, it is difficult to control the beam angle, and when the depth H11 exceeds the range, there is a problem in that the beam angle is narrowed.

The plurality of lead frames 20, 30, and 40 may be disposed on the bottom of the cavity 15A, and a part may be bent to extend to the first side portion 11 of the body 10. The plurality of lead frames 20, 30, and 40 may include the first lead frame 20 and second and third lead frames 30 and 40 spaced apart from the first lead frame 20. The first lead frame 20 may be disposed between the second and third lead frames 30 and 40.

The first lead frame 20 may include a first frame portion 21 disposed in the center of the bottom of the cavity 15A and a first bonding portion 22 extending from the first frame portion 21 to the first side portion 11. The second lead frame 30 may include a second frame portion 31 disposed on one side of the bottom of the cavity 15A and a second bonding portion 32 extending from the second frame portion 31 in the direction of the first side portion 11. The third lead frame 40 may include a third frame portion 41 disposed on the other side of the bottom of the cavity 15A and a second bonding portion 32 extending from the third frame portion 41 in the direction of the first side portion 11.

The plurality of LED chips 71 and 72 are disposed on the first frame portion 21 of the first lead frame 20 and may be connected to the second and third frame portions 31 and 41 by the wires 75 and 76, respectively. As shown in FIG. 8, the first LED chip 71 may be connected to the first frame portion 21 by a bonding member 78, and may be connected to the second frame unit 31 by the wire 75. The second LED chip 72 may be connected to the first frame portion 21 and the first frame portion 21 by a bonding member 79, and may be connected to the third frame portion 41 by the wire 76. The first LED chip 71 and the second LED chip 72 may be vertical chips. The LED chips 71 and 72 may be selected from, for example, a red LED chip, a blue LED chip, a green LED chip, and a yellow green LED chip. The LED chips 71 and 72 may emit, for example, a red peak wavelength. The LED chips 71 and 72 may include at least one of a group II-VI compound and a group III-V compound. The LED chips 71 and 72 may be formed of, for example, a compound selected from the group consisting of GaN, AlGaN, InGaN, AlInGaN, GaP, AlN, GaAs, AlGaAs, InP, and mixtures thereof. As another example, the first LED chip 71 and the second LED chip 72 may be arranged as flip chips on the first to third frame portions 21, 31, and 41. At the bottom of the cavity 15A, separation portions 18 and 19 may be disposed between the first frame portion 21 and the second frame portion 31 and between the first frame portion 21 and the third frame portion 41, respectively. The separation portions 18 and 19 may be arranged in parallel or obliquely to each other.

As shown in FIGS. 8 and 10, the first bonding portion 22 may be disposed on the first side portion 11 of the body 10, that is, it may be disposed on the bottom surface of the second body 10B. In the first bonding part 22, the first frame portion 21 may protrude toward the first side portion 11 of the body 10 and be bent toward the rear portion. The first lead frame 20 may include a plurality of connection portions 25, 26, and 27, and a plurality of coupling holes H1 and H2 disposed between the plurality of connection portions 25, 26 and 27. The protrusion portions P1 and P2 of the body may be exposed through the coupling holes H1 and H2. The second bonding portion 32 of the second lead frame 30 is disposed on the first side portion 11 of the body 10 and may be bent toward the rear portion. The third bonding portion 42 is disposed on the first side portion 11 of the body 10 and may be bent toward the rear portion. The second bonding portion 32 includes a first extension portion 33 to increase the heat dissipation area, and the first extension portion 33 may be bent toward the third side portion 13 of the body 10. The third bonding portion 42 may include a second extension portion 43 to increase the heat dissipation area, and the second extension portion 43 may be bent toward the fourth side portion 14 of the body 10.

Here, the areas of the second lead frame 30 and the third lead frame 40 may be equal to each other. Alternatively, the areas of the second and third bonding portions 32 and 42 may be equal to each other.

As shown in FIG. 2, in the thickness of the body 10, the thickness of the region adjacent to the third and fourth side portions 13 and 14 may be thinner than the thickness of the center region of the body 10. This means that the first side portion 11 of the body 10 may include a region 16 that protrudes with respect to the recessed regions 11B and 11C adjacent to the third and fourth side portions 13 and 14, and the second and third bonding portions 32 and 42 of the second and third lead frames 30 and 40 may be disposed in the recessed region 11B and 11C. A length of the protruding region 16 in a first direction may be smaller than a length of the first frame 21. In addition, in the first frame 21 of the first lead frame 20, a distance C4 between the LED chips 71 and 72 and the first inner side surface 11A is narrower than a distance C3 between the LED chips 71 and 72 and the second inner side surface 12A. Accordingly, the LED chips 71 and 72 may more effectively transfer heat through the first bonding portion 22 extending in the direction of the first inner side surface 11A. The LED chips 71 and 72 may be disposed closer to the first side portion 11 than the second side portion 12. The length Y1 of the LED chips 71 and 72 in the third direction Z may be arranged in a range of 40% or more, for example, in the range of 40% to 60% of the width C1 of the bottom of the cavity 15A. Since the LED chips 71 and 72 are disposed in a large area having a long length in the first and second directions, heat dissipation efficiency may be improved and light efficiency may be increased. The width C1 of the first frame 21 exposed to the bottom of the cavity 15A in the third direction may be greater than the width C2 of the second frame 31. The difference C5 between the width C1 of the first frame 21 and the width C2 of the second frame 31 may be at most 0.1 mm or more, for example, in the range of 0.1 to 0.25 mm. This is to provide a narrowing region when extending from the region where the first frame 21 is disposed to the region where the second frame 31 and the third frame 41 are disposed on the first inner side surface 11A. The narrowing region may correspond to one corner of the LED chips 71 and 72. Accordingly, it is possible to reduce loss of light emitted from each corner of the LED chips 71 and 72 in the outer region of the first inner side surface 11A adjacent to the third and fourth inner side surfaces 13A and 14A. The third and third side portions 13 and 14 of the body 10 may have concave portions 13B and 14B recessed inward, and the concave portions 13B and 14B are formed during the injection process of the body 10 and may be inserted with fingers supporting the body 10. A molding member 80 is disposed in the cavity 15A of the body 10, and the molding member 80 includes a light-transmitting resin such as silicone or epoxy, and may be formed in a single layer or in multiple layers. When the LED chips 71 and 72 are red LED chips, impurities such as phosphors may not be included in the molding member 80. As another example, a phosphor for changing the wavelength of the emitted light may be included on the molding member 80 or disposed on the LED chips 71 and 72, and the phosphor excites some of the light emitted from the LED chips 71 and 72 to emit light of a different wavelength. The phosphor may be selectively formed from quantum dots, YAG, TAG, silicate, nitride, and oxy-nitride-based materials. The phosphor may include at least one of a red phosphor, a yellow phosphor, and a green phosphor, but is not limited thereto. The surface of the molding member 80 may be formed in a flat shape, a concave shape, a convex shape, or the like, but is not limited thereto. As another example, a light-transmitting film having a phosphor may be disposed on the cavity 15A, but the present disclosure is not limited thereto. A gate groove 16B may be formed at the rear side of the body 10. A lens may be further formed on the upper portion of the body 10, and the lens may include a structure of a concave and/or convex lens, and may adjust a light distribution of the light emitted by the first light emitting device 100. A semiconductor device such as a light receiving device or a protection device may be mounted on the body 10 or any one of the lead frames, and the protection device may be implemented as a thyristor, a Zener diode, or a TVS (Transient voltage suppression), and the Zener diode protects the LED chips 71 and 72 from electrostatic discharge (ESD).

Referring to FIGS. 11 to 14, the second light emitting device 102 includes a body 1 having a cavity 1A, lead frames 5 and 6 disposed at the bottom of the cavity 1A of the body 1, and a third LED chip 3 disposed on a fourth frame portion 5A of the fourth lead frame 5.

The third LED chip 3 may be electrically connected to the fourth and fifth lead frames 5 and 6. The third LED chip 3 may be bonded to the fourth frame 5A of the fourth lead frame 5 with a bonding member 3D, and may be connected to the fifth frame portion 6A of the fifth lead frame 6 by the fourth wire 3B. Areas of the fourth and fifth lead frames 5 and 6 may be different from each other. For example, the area of the fourth lead frame 5 may be larger than the area of the fifth lead frame 6, thereby preventing a decrease in the heat dissipation efficiency of the third LED chip 3 in a small package. The fifth lead frame 5 may include a fifth bonding portion 5B and a fifth extension portion 5C extending to one side of the first side portion S21 of the body 1. The sixth lead frame 6 may include a sixth bonding portion 6B and a sixth extension portion 6C extending to the other side of the first side portion S21 of the body 1.

Here, the bottom area of the fifth bonding portion 5B may be larger than the bottom area of the sixth bonding portion 6B. A bottom shape of the fifth bonding portion 5B may be different from a bottom shape of the sixth bonding portion 6B. The length K1 of the first portion 5B1 of the fifth bonding portion 5B may be greater than the length K2 of the first portion 6B1 of the sixth bonding portion 6B, for example, the length K1 may be at least 1.5 times the length K2. The length K3 of the second portion 5B2 and the outer bent portion thereof of the fifth bonding portion 5B may be the same as the length K4 of the second portion 6B2 of the sixth bonding portion 6B and the outer bent portion thereof. Accordingly, the area of the lower surface of the fifth bonding portion 5B of the fifth lead frame 5 on which the third LED chip 3 is disposed is further increased, thereby improving the heat dissipation area and the bonding area. The width K5 of the fifth and sixth extension portions 5C and 6C may be 0.8 times or less, for example, in the range of 0.4 times to 0.8 times the lengths K3 and K4.

As shown in FIG. 14, the third LED chip 3 may be connected to the bonding member 3D bonded to the third LED chip 3 by a third wire 3A for double connection. One end of the third wire 3A may be bonded to the bonding member 3D, and the other end may be bonded to the fourth frame portion 5A. Accordingly, when the bonding member 3D is lifted from the fourth frame portion 5A, the fourth frame portion 5A may be connected to the third LED chip 3 through the third wire 3A. Alternatively, when the third wire 3A is boiled, the fourth frame portion 5A may be connected to the third LED chip 3 through the bonding member 3D. Here, a portion 3D1 of the bonding member 3D may protrude in the direction of the other end of the third wire 3A, thereby providing a wide bonding area with one end of the third wire 3A. The fourth wire 3B has a multi-stage contact with the fifth frame portion 6A, and may further include, for example, a sub-wire 3C in which the contacts are jumped to be spaced apart or extended in a different direction.

Referring to FIGS. 9 and 11, the bottom width T3 of the cavity 15A of the first light emitting device 100 may be the same as the bottom width T4 of the cavity 1A of the second light emitting device 102. The height H11 of the cavities 15A and 1A of the first light emitting device 100 and the second light emitting device 102 may be equal to each other. In the bottom lengths D3 and D31 of the cavities 15A and 1A of the first light emitting device 100 and the second light emitting device 102, the bottom length D31 may be 0.7 times or less of the bottom length D3, for example, in the range of 0.4 times to 0.7 times. The first to third LED chips 71, 72, and 3 emit light of the same color wavelength and may have the same size. The first light emitting device 100 and the second light emitting device 102 may have the same widths H0 and H01 in the second direction. Here, the body 10 of the first light emitting device 100 may be defined as a first body, and the body 1 of the second light emitting device 102 may be defined as a second body. Also, the cavity 15A of the first light emitting device 100 may be defined as a first cavity, and the cavity 1A of the second light emitting device 102 may be defined as a second cavity. Here, the length D11 of the second light emitting device 102 is arranged in a range of 2.5 times or less, for example, 1.5 times to 2.5 times of the thickness T2, so that the decrease in the thickness T2 of the body 1 is minimized and only the length D11 of the body 1 is reduced, it may be applied to the second region R2 (FIG. 1) having a thin width.

As shown in 15, in the first light emitting device 100, each of the first to third lead frames 20, 30, and 40 may be bonded to a plurality of pads 452, 453,454 of the substrate 401 and a bonding member 250. In the second light emitting device 102, each of the fourth and fifth lead frames 5 and 6 may be bonded to the plurality of pads 455 and 456 of the substrate 401 by a bonding member 250. The first and second light emitting devices 100 and 102 are disposed on the substrate 401, and the first and second light emitting devices 100 and 102 may have different numbers of LED chips 71, 72 and 3. The first and second light emitting devices 100 and 102 may have different lengths. For example, the length of the second light emitting device 102 may be shorter than that of the first light emitting device 100.

Figure 16:
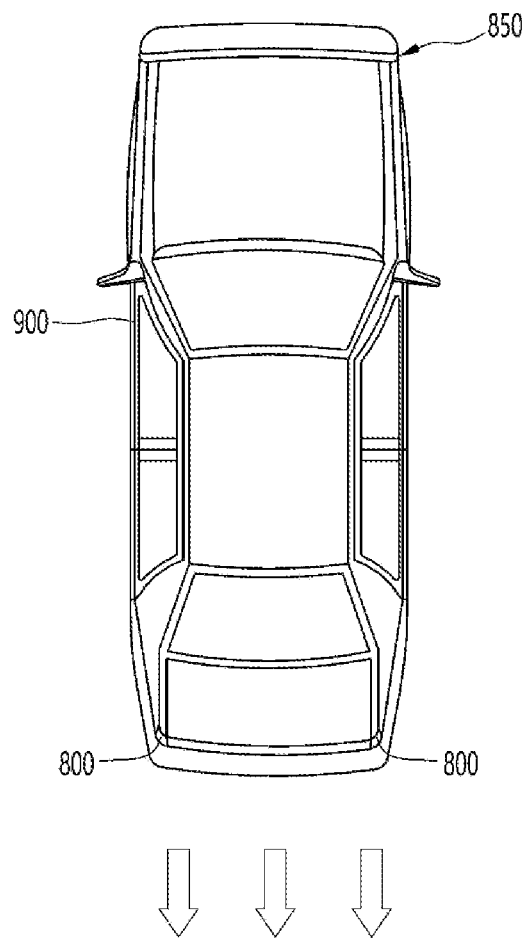
FIG. 16 is a view showing an example of a plan view of a vehicle having the lighting device of the invention.
Figure 17:
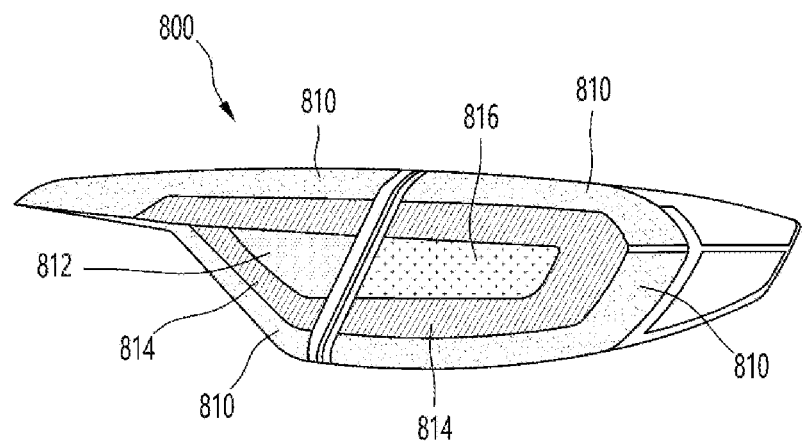
FIG. 17 is an example of a tail lamp of a vehicle to which the lighting device of FIG. 16 is applied.

FIG. 16 is a plan view of a vehicle to which a vehicle lamp to which a lighting device is applied according to an embodiment is applied, and FIG. 17 is a view showing an example of a tail lamp of the vehicle of FIG. 16.

Referring to FIGS. 16 and 17, the front lamp 850 in the moving object or vehicle 900 may include one or more lighting modules, and control the driving timing of these lighting modules individually to function as a typical headlamp as well as, when the driver opens the vehicle door, additional functions such as a welcome light or a celebration effect can be provided. The lamp may be applied to a daytime running lamp, a high beam, a low beam, a fog lamp or a turn signal lamp. In the vehicle 900, the tail lamp 800 may be arranged with a plurality of lamp units 810, 812, 814, and 816 supported by the housing 801. For example, the lamp units 810, 812, 814, and 816 may include a first lamp unit 810 disposed outside, a second lamp unit 814 disposed around the inner circumference of the first lamp unit 810, and third and fourth lamp units 814 and 816 respectively disposed on the inside the second lamp unit 814. The first to fourth lamp units 810, 812, 814, and 816 may selectively apply the lighting device disclosed in the embodiment, and a red lens cover or a white lens cover for the lighting characteristics of the lamp units 810, 812, 814, and 816 on the outside of the lighting device may be placed. The lighting device disclosed in the embodiment applied to the lamp units 810, 812, 814, and 816 may emit surface light in a uniform distribution. The first and second lamp units 810 and 812 may be provided in at least one of a curved shape, a straight shape, an angled shape, an inclined shape, and a flat shape, or a mixed structure thereof. One or a plurality of the first and second lamp units 810 and 812 may be disposed in each tail lamp. The first lamp unit 810 may be provided as a tail lamp, the second lamp unit 812 may be provided as a brake lamp, and the third lamp unit 814 may be provided as a reverse lamp, and the fourth lamp unit 816 may be provided as a turn signal lamp. The structure and position of these lighting lamps can be changed.

Features, structures, effects, etc. described in the above embodiments are included in at least one embodiment of the invention, and are not necessarily limited to only one embodiment. Furthermore, features, structures, effects, etc. illustrated in each embodiment can be combined or modified for other embodiments by those of ordinary skill in the art to which the embodiments belong. Accordingly, the contents related to such combinations and modifications should be interpreted as being included in the scope of the invention. In addition, although the embodiment has been described above, it is merely an example and does not limit the invention, and those of ordinary skill in the art to which the invention pertains are exemplified above in a range that does not depart from the essential characteristics of the present embodiment. It can be seen that various modifications and applications that have not been made are possible. For example, each component specifically shown in the embodiment can be implemented by modification. And differences related to such modifications and applications should be construed as being included in the scope of the invention defined in the appended claims.

The invention claimed is:

1. A lighting device comprising:
a substrate;
a reflective layer disposed on the substrate;
a light source passing through the reflective layer and disposed on the substrate;
a resin layer disposed on the reflective layer;
an optical pattern disposed on the resin layer;
an air gap portion disposed around the optical pattern; and
a light-transmitting layer disposed outside the air gap portion and including a resin material,
wherein the light source includes a first light emitting device and a second light emitting device spaced apart from the first light emitting device,
wherein the optical pattern includes a first optical pattern disposed on the first light emitting device and a second optical pattern disposed on the second light emitting device,
wherein the first optical pattern and the second optical pattern have different areas,
wherein the resin layer covers the light source,
wherein the first optical pattern overlaps the first light emitting device in a vertical direction and reflects a light emitted through an emission surface of the first light emitting device,
wherein the second optical pattern overlaps the second light emitting device in the vertical direction and reflects a light emitted through an emission surface of the second light emitting device,
wherein the air gap portion is disposed around each of the first and second optical patterns, wherein the air gap portion and the light-transmitting layer are disposed on the resin layer,
wherein upper surfaces of the first light emitting device and the second light emitting device have different areas,
wherein the emission surfaces of the first light emitting device and the second light emitting device have different areas,
wherein each of the first and second optical patterns has a reflective material, and
wherein each of the first and second optical patterns has regions with different thicknesses.

2. The lighting device of claim 1,
wherein each of the first optical pattern and the second optical pattern has a plurality of unit pattern layers having different areas and overlapping each other in the vertical direction.

3. The lighting device of claim 1,
wherein an area of a unit pattern layer disposed on an uppermost side of the first optical pattern is larger than an area of a unit pattern layer disposed on an uppermost side of the second optical pattern, and
wherein the area of the upper surface of the first light emitting device is larger than the area of the upper surface of the second light emitting device.

4. The lighting device of claim 2,
wherein an area of an uppermost unit pattern layer among the plurality of unit pattern layers of the first optical pattern is larger than an area of a lowermost unit pattern layer, and
wherein the area of the upper surface of the first light emitting device is larger than the area of the upper surface of the second light emitting device.

5. The lighting device of claim 1,
wherein the reflective layer comprises a first hole in which the first light emitting device is disposed and a second hole in which the second light emitting device is disposed,
wherein the area of the upper surface of the first light emitting device is larger than the area of the upper surface of the second light emitting device, and
wherein the first hole is larger than the second hole.

6. The lighting device of claim 5,
wherein a length of the first hole in a long axis direction is greater than a length of the second hole in a long axis direction.

7. The lighting device of claim 1,
wherein the area of the upper surface of the first light emitting device is larger than the area of the upper surface of the second light emitting device,
wherein a maximum length of the first optical pattern is in a range of 2.4 times to 2.6 times based on a long axis length of the first light emitting device, and
wherein a maximum length of the second optical pattern is in a range of 3.6 times to 3.8 times a long axis length of the second light emitting device and is smaller than the maximum length of the first optical pattern.

8. A lighting device comprising:
a substrate;
a reflective layer disposed on the substrate;
a light source passing through the reflective layer and disposed on the substrate;
a resin layer disposed on the reflective layer;
an optical pattern disposed on the resin layer;
an air gap portion disposed around the optical pattern; and
a light-transmitting layer disposed outside the air gap portion and including a resin material,
wherein the light source includes a first light emitting device and a second light emitting device spaced apart from the first light emitting device,
wherein the first light emitting device and the second light emitting device include different numbers of LED chips,
wherein a length of a long axis direction of the first light emitting device and a length of a long axis direction of the second light emitting device are different from each other,
wherein the resin layer covers the light source,
wherein the optical pattern includes a first optical pattern and a second optical pattern spaced apart from the first optical pattern,
wherein the first optical pattern overlaps the first light emitting device in a vertical direction and reflects light emitted through an emission surface of the first light emitting device,
wherein the second optical pattern overlaps the second light emitting device in the vertical direction and reflects light emitted through an emission surface of the second light emitting device,
wherein the air gap portion is disposed around each of the first and second optical patterns,
wherein the air gap portion and the light-transmitting layer are disposed on the resin layer,
wherein the emission surfaces of the first light emitting device and the second light emitting device have different areas,
wherein upper surfaces of the first light emitting device and the second light emitting device have different areas,
wherein each of the first and second optical patterns has a reflective material, and
wherein each of the first and second optical patterns has regions with different thicknesses.

9. The lighting device of claim 8,
wherein each of the first and second light emitting device is a side view type LED package,
wherein the first light emitting device comprises a first lead frame, a second lead frame, and a third lead frame, wherein the second and third lead frames are disposed on opposing sides of the first lead frame and having a same area from each other, and
wherein the second light emitting device includes a fourth lead frame and a fifth lead frame having an area different from an area of the fourth lead frame.

10. The lighting device of claim 9,
wherein the first light emitting device comprises: a first body to which the first to third lead frames are coupled to a bottom of a first cavity; and a plurality of LED chips on the first lead frame disposed in the first cavity,
wherein the first cavity is disposed on a front surface of the first body,
wherein the first body includes a first side portion facing the substrate, and
wherein each of the first to third lead frames includes a bonding portion bent to the first side portion of the first body.

11. The lighting device of claim 10,
wherein the second light emitting device comprises: a second body in which fourth and fifth lead frames are disposed as a bottom of a second cavity; at least one LED chip disposed on the fourth lead frame disposed on the bottom of the second cavity; a bonding member bonding between the fourth lead frame and the LED chip; and a first wire having both ends connected between the bonding member and the fourth lead frame, and wherein bottom lengths of the first and second cavities are different from each other.

12. The lighting device of claim 11, comprising a second wire connecting the fifth lead frame and the LED chip of the second light emitting device, wherein the second wire includes a sub-wire having a multi-stage contact on an upper surface of the fifth lead frame, and wherein the LED chip of the first light emitting device and the LED chip of the second light emitting device emit the same color.

13. A lighting device comprising:
a substrate;
a reflective layer disposed on the substrate;
a light source passing through the reflective layer and disposed on the substrate;
a resin layer disposed on the reflective layer; and
a plurality of optical patterns disposed on the resin layer;
a plurality of air gap portions disposed around each of the plurality of optical patterns; and
a light-transmitting layer disposed outside the plurality of air gap portions and including a resin material,
wherein the light source includes M first light emitting devices and N second light emitting devices spaced apart from the M first light emitting devices, wherein M is a natural number greater than N,
wherein a length in a long axis direction of the first light emitting device is greater than a length in a long axis direction of the second light emitting device,
wherein a maximum width of the resin layer overlapping in the long axis direction of the second light emitting device passing over a center of the second light emitting device is in a range of 2 to 2.2 times the length of the long axis direction of the first light emitting device,
wherein the resin layer covers the light source,
wherein each of the plurality of optical patterns overlaps a portion of each of the first and second light emitting devices in a vertical direction and reflects light emitted through an emitting surface of each of the first and second light emitting devices,
wherein the air gap portions and the light-transmitting layer are disposed on the resin layer,
wherein upper surface of each of the first light emitting devices has a larger area than an area of upper surface of each of the second light emitting devices,
wherein the emission surface of each of the first light emitting devices has a larger area than an area of the emission surface of each of the second light emitting devices,
wherein each of the plurality of optical patterns has a reflective material, and
wherein each of the plurality of optical patterns has regions with different thicknesses.

14. The lighting device of claim 13,
wherein the maximum width of the resin layer on an upper portion of the second light emitting device is 2.2 times or less of the length of the first light emitting device in the long axis direction.

15. The lighting device of claim 13,
wherein the resin layer comprises:
a first region having a minimum first width and in which a plurality of the first light emitting devices is arranged; and
a second region having a maximum second width and in which at least one second light emitting device is disposed,
wherein the second width is smaller than the first width, greater than the length in the long axis direction of the second light emitting device, and is 2.2 times or less the length in the long axis direction of the second light emitting device, and
wherein the second region has the second width and extends from the second light emitting device to a length of at least 5 times a width of a short axis of the second light emitting device in a light emission direction of the second light emitting device.

16. The lighting device of claim 15,
wherein the second light emitting device is disposed at a position closest to a side surface of the resin layer among the first and second light emitting devices, and
wherein a LED chip of the first light emitting device and a LED chip of the second light emitting device emit the same color.

17. The lighting device of claim 16,
wherein the optical pattern comprises: a first optical pattern overlapping a portion of each of the first light emitting devices in a vertical direction; and a second optical pattern overlapping a portion of the second light emitting device in the vertical direction, and
wherein the second optical pattern is disposed most adjacent to a side surface of the resin layer among the first and second optical patterns.

18. The lighting device of claim 17,
wherein a maximum length of the first optical pattern is 2.6 times or less of the length in the long axis direction of the first light emitting device, and
wherein a maximum length of the second optical pattern is smaller than the maximum length of the first optical pattern.

19. The lighting device of claim 17,
wherein a thickness of a center region of each of the first and second optical patterns is greater than a thickness of an edge region.

20. The lighting device of claim 17,
wherein a width of the second optical pattern is smaller than a width of the first optical pattern, and
wherein a maximum thickness of the first optical pattern and a maximum thickness of the second optical pattern are the same.

* * * * *